United States Patent
Tanaka et al.

(10) Patent No.: US 8,941,229 B2
(45) Date of Patent: Jan. 27, 2015

(54) SEMICONDUCTOR DEVICE AND METHOD OF MANUFACTURING THE SAME

(71) Applicant: DENSO CORPORATION, Kariya, Aichi-pref. (JP)

(72) Inventors: Masaya Tanaka, Gifu (JP); Tetsuo Fujii, Toyohashi (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/059,662

(22) Filed: Oct. 22, 2013

(65) Prior Publication Data

US 2014/0048922 A1    Feb. 20, 2014

Related U.S. Application Data

(62) Division of application No. 12/968,470, filed on Dec. 15, 2010, now abandoned.

(30) Foreign Application Priority Data

Dec. 17, 2009  (JP) .................................. 2009-286874
Nov. 9, 2010   (JP) .................................. 2010-251092

(51) Int. Cl.
  *H01L 23/48*     (2006.01)
  *H01L 23/498*    (2006.01)
  (Continued)

(52) U.S. Cl.
  CPC .............. *H01L 23/498* (2013.01); *B81B 7/007* (2013.01); *H01L 21/84* (2013.01); *H01L 24/03* (2013.01);
  (Continued)

(58) Field of Classification Search
  CPC ........ H01L 24/481; H01L 24/05; H01L 24/48

USPC ........................................... 257/690, E29.324
See application file for complete search history.

(56) References Cited

U.S. PATENT DOCUMENTS 6,250,165 B1 *   6/2001   Sakai et al. ..................... 73/754
6,875,673 B2 *   4/2005   Ishio .............................. 438/462
(Continued)

FOREIGN PATENT DOCUMENTS

JP     2000164890 A  *  6/2000   .............. H01L 29/84
JP     2005-233622 A     9/2005
(Continued)

OTHER PUBLICATIONS

Japanese Office Action issued from the Japanese Patent Office mailed on Jul. 3, 2012 for the corresponding JP patent application No. 2010-251092 (with English translation).

*Primary Examiner* — Joseph C Nicely
(74) *Attorney, Agent, or Firm* — Posz Law Group, PLC

(57) ABSTRACT

A semiconductor device includes a base substrate made of silicon, a cap substrate and a leading electrode having a metal part. The base substrate has base semiconductor regions being insulated and separated from each other at a predetermined portion of a surface layer thereof. The cap substrate is bonded to the predetermined portion of the surface layer of the base substrate. The leading electrode has a first end connected to one of the plurality of base semiconductor regions of the base substrate and extends through the cap substrate such that a second end of the leading electrode is located adjacent to a surface of the cap substrate for allowing an electrical connection with an external part, the surface being opposite to a bonding surface at which the base substrate and the cap substrate are bonded. The leading electrode defines a groove between an outer surface thereof and the cap substrate.

4 Claims, 27 Drawing Sheets

(51) Int. Cl.
  *B81B 7/00* (2006.01)
  *H01L 21/84* (2006.01)
  *H01L 23/00* (2006.01)
  *H01L 27/12* (2006.01)
  *H01L 21/768* (2006.01)

(52) U.S. Cl.
  CPC ............... *H01L 24/05* (2013.01); *H01L 24/48* (2013.01); *H01L 27/1203* (2013.01); *H01L 21/768* (2013.01); *B81B 2201/0235* (2013.01); *B81B 2207/095* (2013.01); *B81C 2203/0118* (2013.01); *H01L 21/76898* (2013.01); *H01L 2224/04042* (2013.01); *H01L 2224/05171* (2013.01); *H01L 2224/05184* (2013.01); *H01L 2224/05556* (2013.01); *H01L 2224/05624* (2013.01); *H01L 2224/05647* (2013.01); *H01L 2224/05669* (2013.01); *H01L 2224/4845* (2013.01); *H01L 2224/48463* (2013.01); *H01L 2924/01004* (2013.01); *H01L 2924/01013* (2013.01); *H01L 2924/01014* (2013.01); *H01L 2924/01029* (2013.01); *H01L 2924/01058* (2013.01); *H01L 2924/01074* (2013.01); *H01L 2924/01078* (2013.01); *H01L 2924/01082* (2013.01); *H01L 2924/014* (2013.01); *H01L 2924/14* (2013.01); *H01L 2924/16235* (2013.01); *H01L 2924/01005* (2013.01); *H01L 2924/01006* (2013.01); *H01L 2924/01024* (2013.01); *H01L 2924/01033* (2013.01); *H01L 2924/01055* (2013.01); *H01L 2924/01072* (2013.01)

USPC .................................. 257/690; 257/E29.324

(56) References Cited

U.S. PATENT DOCUMENTS

| | | | |
|---|---|---|---|
| 7,357,017 B2 | 4/2008 | Felton et al. | |
| 7,821,085 B2 | 10/2010 | Suzuki et al. | |
| 7,851,925 B2 | 12/2010 | Theuss et al. | |
| 8,217,516 B2 | 7/2012 | Takahashi et al. | |
| 8,283,738 B2 | 10/2012 | Fujii et al. | |
| 8,413,507 B2 * | 4/2013 | Fujii et al. | 73/504.12 |
| 2002/0127822 A1 * | 9/2002 | Ueyanagi et al. | 438/459 |
| 2004/0043615 A1 | 3/2004 | Yamamoto et al. | |
| 2006/0014392 A1 * | 1/2006 | Benzel et al. | 438/700 |
| 2008/0030205 A1 * | 2/2008 | Fujii et al. | 324/661 |
| 2008/0099862 A1 * | 5/2008 | Fujii et al. | 257/417 |
| 2008/0290490 A1 * | 11/2008 | Fujii et al. | 257/684 |
| 2009/0127624 A1 * | 5/2009 | Sumitomo et al. | 257/350 |
| 2009/0229370 A1 * | 9/2009 | Fujii et al. | 73/780 |
| 2009/0261430 A1 * | 10/2009 | Suzuki et al. | 257/417 |
| 2010/0176466 A1 * | 7/2010 | Fujii et al. | 257/415 |
| 2010/0266145 A1 | 10/2010 | Aimo Suvanto | |
| 2011/0133295 A1 * | 6/2011 | Fujii et al. | 257/415 |
| 2011/0147863 A1 * | 6/2011 | Fujii et al. | 257/418 |
| 2012/0068313 A1 | 3/2012 | Pagaila et al. | |
| 2013/0087928 A1 | 4/2013 | Paraila et al. | |

FOREIGN PATENT DOCUMENTS

| | | |
|---|---|---|
| JP | 2005-251898 A | 9/2005 |
| JP | 2008-091417 A | 4/2008 |
| JP | 2008-256495 A | 10/2008 |

* cited by examiner

SEMICONDUCTOR DEVICE AND METHOD OF MANUFACTURING THE SAME

CROSS REFERENCE TO RELATED APPLICATIONS

The present application is a divisional of application Ser. No. 12/968,470 filed on Dec. 15, 2010 which is based on and claims priority to Japanese Patent Applications No. 2009-286874 filed on Dec. 17, 2009 and No. 2010-251092 filed on Nov. 9, 2010, the disclosures of which are incorporated in their entirety herein by reference.

FIELD OF THE INVENTION

The present invention relates to a semiconductor device and a method of manufacturing the same. More particularly, the present invention relates to a semiconductor device having a cap substrate bonded to a base substrate made of silicon for protecting various elements formed in a surface layer of the base substrate, and a method of manufacturing the same.

BACKGROUND OF THE INVENTION

In a semiconductor device, it is known to bond a cap substrate to a base substrate for protecting various element formed in a surface layer of the base substrate.

In such a semiconductor device, an electrical connection for electrically connecting the base substrate and an external part is necessary. For example, it is known to make a bonding wire directly on the surface of the base substrate through a through hole formed in the cap substrate. In such a method, however, a large through hole is required in the cap substrate to conduct wire bonding. That is, an area necessary for making the electrical connection is likely to increase.

In order to ease the electrical connection between the element and the external part by the wire bonding, soldering or the like in a small area, a leading electrode that extends from the base substrate to the surface of the cap substrate and allows the electrical connection at the end can be employed.

It has been known to use a portion of the cap substrate as the leading electrode. For example, the cap substrate made of silicon is divided into partial regions by an insulating and separating trench, and a specific region of the partial regions, which connects to an insulated and separated base semiconductor region of the base substrate, is used as a leading conductive region. The upper end of the specific region is electrically connected to the external part by the wire bonding, soldering or the like.

A semiconductor device having such an electrical connection structure is, for example, described in Japanese Patent Application Publications No. JP2008-229833A (Publication 1, corresponding to US2008/0290490A1) and No. JP2008-256495 (Publication 2).

FIG. 30 shows an example of the semiconductor device described in Publication 1. A semiconductor device 91 shown in FIG. 30 has a semiconductor base substrate B2 and a conductive cap substrate C2 bonded to the base substrate B2.

The base substrate B2 is a SOI (Silicon On Insulator) substrate in which an embedded oxide film 20 is interposed between a SOI layer 21 and a support substrate 22. Insulated and separated multiple base semiconductor regions Bs are formed in a surface layer of the base substrate B2. The base semiconductor regions Bs are provided by the SOI layer 21, and are insulated and separated from adjacencies by a trench 23 that reaches the embedded oxide film 20. Projections T1 are formed above the base semiconductor regions Bs. The projections T1 are provided by a conductive film 50, which is made of poly crystal silicone, metal or the like.

The semiconductor device 91 includes a mechanical quantity sensor element for measuring a mechanical quantity, such as acceleration and angular velocity, using an inertia force. The mechanical quantity sensor element is constructed of the multiple base semiconductor regions Bs. Specifically, the base semiconductor regions Bs include at least two base semiconductor regions Bs1 and two base semiconductor regions Bs2.

The base semiconductor regions Bs1 constitute a movable semiconductor region. The base semiconductor regions Bs1 are formed by performing sacrifice layer etching on a part of the embedded oxide film 20. The base semiconductor regions Bs1 as the movable semiconductor region include a movable electrode Em, which is formed to be displaceable.

The base semiconductor regions Bs2 constitute a fixed semiconductor region including a fixed electrode Es opposed to the movable electrode Em. The two base semiconductor region Bs1 and the two base semiconductor region Bs2 each form a continuous and integrated region on a plane.

In the semiconductor device 91, a capacitance is created between opposed surfaces of the movable electrode Em and the fixed electrode Es. As the movable electrode Em is displaced in a direction perpendicular to the opposed surfaces in accordance with the applied mechanical quantity, the capacitance changes in accordance with a change in the distance between the movable electrode Em and the fixed electrode Es Thus, the applied mechanical quantity is detected by measuring the change in capacitance.

The cap substrate C2 is provided by a single crystal silicon substrate 30 on which multiple cap conductive regions Ce as partial regions are formed. The cap conductive regions Ce are divided by an insulating and separating trench 31 that passes through the single crystal silicon substrate 30. The cap substrate C2 has a surface protection layer 33 made of silicon oxide ($SiO_2$) or the like, and electrode pads 34 made of aluminum (Al) or the like.

The cap substrate C2 is bonded to the projections T1 formed on the base semiconductor regions Bs, and a bonding surface D1 is formed therebetween. The bonding surface D1 has a loop shape in a predetermined region R1 of the base substrate B2. Thus, a space sealed in a highly vacuum condition is provided between the surface of the predetermined region R1 and the surface of the cap substrate C2 by bonding the base substrate B2 and the cap substrate C2.

Also, as the base substrate B2 and the cap substrate C2 are bonded, specific cap conductive regions Ce1, Ce2 are electrically connected to the specific base semiconductor regions Bs1, Bs2, respectively, to serve as leading conductive regions. In other words, the leading conductive regions Ce1, Ce2 are respectively connected to the movable semiconductor region Bs1 and the fixed semiconductor region Bs2, respectively.

FIG. 31 shows an example of a semiconductor device described in Publication 2. A semiconductor device 92 of FIG. 31 has a semiconductor mechanical quantity sensor element for detecting a mechanical quantity, such as acceleration and angular velocity, similar to the semiconductor device 91 of FIG. 30.

The semiconductor device 92 has a base substrate B3 provided by a SOI substrate. The SOI substrate includes a support substrate 11 made of silicon semiconductor and a poly silicon layer 12 disposed on the support substrate 11 through an oxide film 13. Sensing portions Se are formed by the poly silicon layer 12 disposed on the support substrate 11.

Similar to the semiconductor device 91 of FIG. 30, the sensing portions Se include a movable electrode and a fixed electrode. The movable electrode and the fixed electrode are provided by a beam structure, which is generally used in conventional acceleration sensors and angular velocity sensors. As the movable electrode is displaced in accordance with the applied acceleration or angular velocity, the capacitance between the movable electrode and the fixed electrode is changed. A voltage signal indicative of the change in capacitance is produced.

Further, a cap C3 is fixed to the base substrate B3 to surround the sensing portions Se. The cap C3 is bonded to the poly silicon Gayer 12 through an adhesive layer Ds made of a resin adhesive or the like. The cap C3 is provided with penetrating electrodes Ke. The cap C3 is made of silicon semiconductor in which impurities, such as phosphorous (P) and boron (B), are preferably doped so as to have electrical conductivity.

The penetrating electrodes Ke pass through the cap C3 in a direction in which a thickness of the cap C3 is measured. The penetrating electrodes Ke serve to lead electrical signals from the sensing portions Se, which are located under the cap C3, to the upper surface of the cap C3. The penetrating electrodes Ke are constituted as portions of the cap C3 having the electrical conductivity.

Further, the cap C3 is formed with grooves 15, which are referred to as air isolations, on peripheries of the penetrating electrodes Ke. The grooves 15 surround the penetrating electrodes Ke, and pass through the cap C3 in the direction in which the thickness of the cap C3 is measured.

Thus, the penetrating electrodes Ke and portions of the cap C3 on the peripheries of the penetrating electrodes Ke are insulated by means of the grooves 15. That is, the grooves 15 serve as electrically insulating portions to electrically insulate the penetrating electrodes Ke from the peripheral portions thereof in the cap C3. The penetrating electrodes Ke are in contact with the poly silicon layer 12 through connecting electrodes 51, which are made of aluminum, Al—Si or the like, to make electrical connection with the sensing portions Se.

In the semiconductor device 91 of FIG. 30, the cap substrate C2 serves as a sealing cap for protecting the mechanical quantity sensor element formed in the predetermined region R1 of the surface layer of the base substrate B2.

The cap conductive regions Ce1, Ce2 of the cap substrate C2, which are electrically connected to the base semiconductor regions Bs1, Bs2 of the base substrate B2, serve as leading conductive regions.

In such a structure, however, the insulating and separating trench 31 exist on the peripheries of the leading conductive regions Ce1, Ce2 to isolate the leading conductive regions Ce1, Ce2 from the peripheral cap conductive regions. Therefore, parasitic capacitance is produced due to the insulating and separating trench 31 being an electric substance, and is likely to affect performance of the semiconductor device 91.

In the semiconductor device 92 of FIG. 31, on the other hand, the penetrating electrodes Ke are electrically insulated from the peripheral portions in the cap C3 by the grooves 15 as the air isolations. Therefore, the electric permittivity at the grooves 15 is smaller than that at the trench 31 of the semiconductor device 91 in which the electric substance is embedded. That is, the semiconductor device 92 of FIG. 31 is less apt to generate the parasitic capacitance, as compared with the semiconductor device 91 of FIG. 30.

The semiconductor device 91 employs the cap substrate C2 made of single crystal silicon. The semiconductor device 92 employs the cap substrate C3 made of silicon semiconductor. In general, silicon is less expensive than other substrate materials, and a trench is easily formed in a silicon substrate.

However, silicon has a relatively large specific resistance. Therefore, the leading conductive regions Ce1, Ce1 and the penetrating electrodes Ke are likely to increase resistance, and hence the applicable range of such semiconductor devices may be restricted.

SUMMARY OF THE INVENTION

It is an object of the present invention to provide a semiconductor device having a base substrate and a cap substrate bonded to the base substrate for protesting the base substrate, in which a leading electrode for allowing an electrical connection between the base substrate and an external part has a structure capable of reducing resistance, and the leading electrode and a neighboring portion thereof have a structure capable of reducing occurrence of parasitic capacitance, and a method of manufacturing the semiconductor device.

According to an aspect of the present invention, a semiconductor device includes a base substrate, a cap substrate and a leading electrode for allowing an electrical connection between the base substrate and an external device. The base substrate is made of silicon and has a plurality of base semiconductor regions in a predetermined portion of a surface layer thereof. The cap substrate is bonded to the predetermined portion of the surface layer of the base substrate. The leading electrode includes a metal part. The leading electrode passes through the cap substrate. A first end of the leading electrode is connected to one of the plurality of base semiconductor regions. A second end of the leading electrode is located adjacent to a surface of the cap substrate, the surface being opposite to a bonding surface at which the base substrate and the cap substrate are bonded, to allow the electrical connection with an external part. Further, a groove is formed between the leading electrode and the cap substrate.

The leading electrode has the metal part having conductivity higher than that of silicon. Hence, the resistance at the leading electrode can be reduced, as compared with a conventional semiconductor device. Further, the groove is formed between the leading electrode and the cap substrate. That is, because the leading electrode has an air isolation structure, the conventional insulating and separating trench for forming the leading conductive region is not employed. Therefore, parasitic capacitance will not be easily created. In addition, stress due to a thermal expansion difference between the metal part and the cap substrate is reduced.

According to a second aspect of the present invention, a method of manufacturing a semiconductor device includes: forming a base substrate made of silicon; forming a cap substrate; bonding the cap substrate to a predetermined portion of the base substrate; and forming a leading electrode including a metal part. The base substrate has a plurality of base semiconductor regions in the predetermined portion of a surface layer thereof, and the plurality of base semiconductor regions is insulated and separated from each other. The leading electrode passes through the cap substrate. The leading electrode has a first end connected to one of the plurality of base semiconductor regions and a second end located adjacent to a surface of the cap substrate. The leading electrode defines a groove between an outer surface thereof and the cap substrate.

In the semiconductor device manufactured by the above method, similar effects as described in the above are achieved.

BRIEF DESCRIPTION OF THE DRAWINGS

Other objects, features and advantages of the present invention will become more apparent from the following detailed description made with reference to the accompanying drawings, in which like parts are designated by like reference characters and in which.

DETAILED DESCRIPTION OF EXEMPLARY EMBODIMENT

Figure 1A:
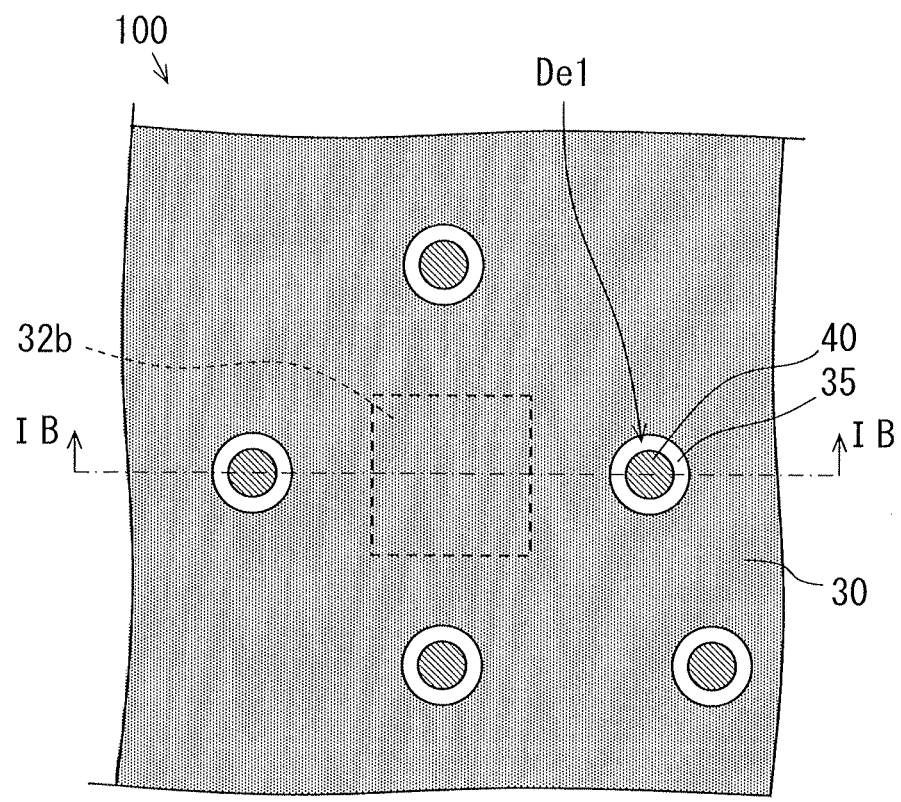
FIG. 1A is a schematic cross-sectional view of a part of a semiconductor device as an example according to an embodiment of the present invention.
Figure 1B:
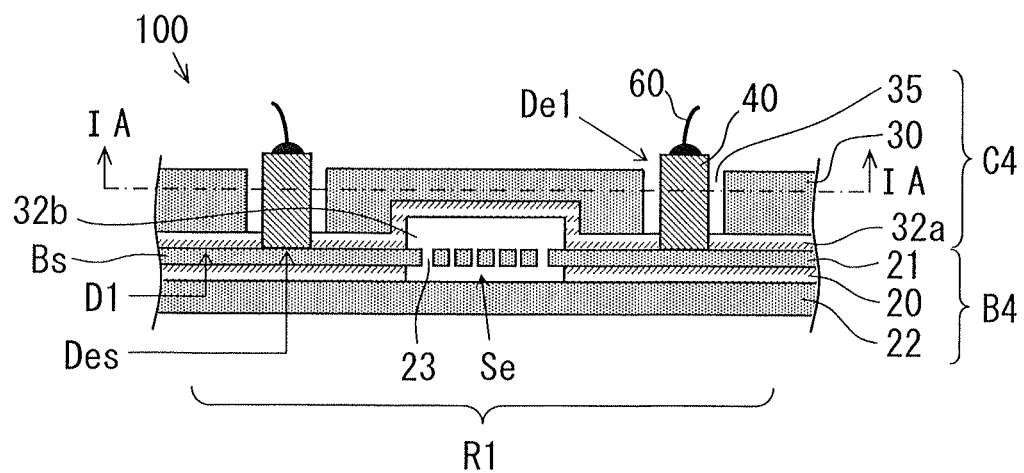
FIG. 1B is a schematic cross-sectional view taken along a line IB-IB in FIG. 1A.
Figure 2:
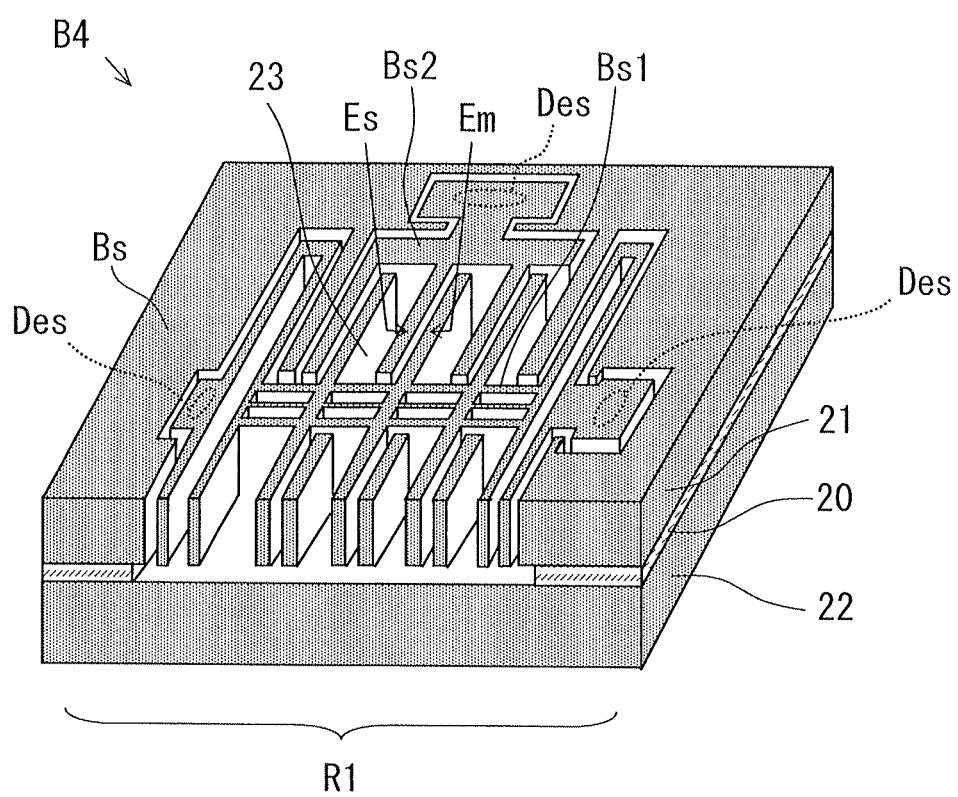
FIG. 2 is a perspective view of a base substrate of the semiconductor device shown in FIGS. 1A and 1B.

FIG. 1A is a schematic plan view of a part of a semiconductor device 100 as an example of the semiconductor device according to an embodiment. FIG. 1B is a schematic cross-sectional view taken along a line IB-IB in FIG. 1A. FIG. 1A is also a cross-section taken along a line IA-IA in FIG. 1B. FIG. 2 is a perspective view of a base substrate of the semiconductor device 100 shown in FIGS. 1A and 1B.

Figure 30:
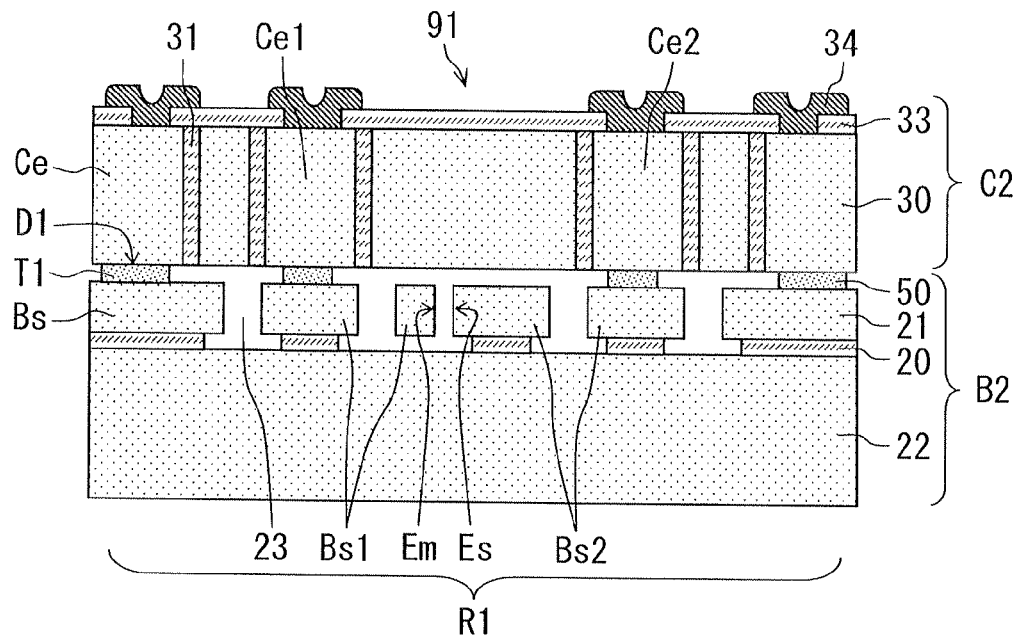
FIG. 30 is a schematic cross-sectional view of a part of a semiconductor device of a prior art.
Figure 31:
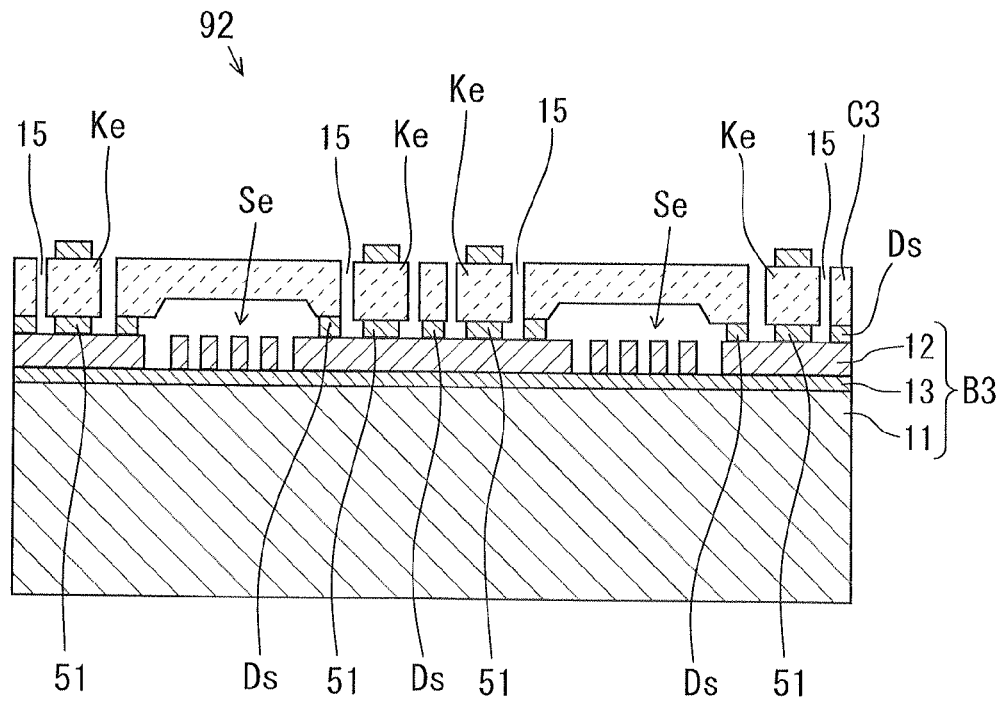
FIG. 31 is a schematic cross-sectional view of a part of a semiconductor device of another prior art.

In FIGS. 1A, 1B and 2 like parts which correspond to parts of the semiconductor devices 91, 92 of FIGS. 30 and 31, are designated with like reference characters.

Referring to FIGS. 1A and 1B, the semiconductor device 100 has a base substrate B4 made of silicon and a cap substrate C4 made of silicon. The base substrate B4 and the cap substrate C4 are bonded to each other at a bonding surface D1.

The semiconductor device 100 includes a mechanical quantity sensor element using an inertia force. A sensing portion Se for detecting mechanical quantity such as acceleration and angular velocity is formed in a predetermined region R1 of the base substrate B4.

The cap substrate C4 is formed with a recess 32b. The cap substrate C4 is bonded to the base substrate B4 to oppose the predetermined region R1 where the sensing portion Se is formed Thus, the cap substrate C4 seals a space defined by the recess 32b and a trench 23 of the base substrate B4.

The base substrate B4 is a SOI (Silicon On Insulator) substrate having an embedded oxide film 20, a SOI layer 21 and a support substrate 22. The embedded oxide film 20 is disposed between the SOI layer 21 and the support substrate 22. The base substrate B4 has multiple base semiconductor regions Bs including base semiconductor regions Bs1, Bs2 in a surface layer thereof. The base semiconductor regions Bs are provided by the SOI layer 21. The base semiconductor regions Bs are insulated and separated from each other by the trench 23 that reaches the embedded oxide film 20.

The sensing portion Se includes a mechanical quantity sensor element for measuring acceleration or angular velocity. The mechanical quantity sensor element is constructed of some of the base semiconductor regions Bs.

The base semiconductor region Bs1 is a movable semiconductor region including a movable electrode Em. The movable electrode Em is formed by performing sacrifice layer etching on a part of the embedded oxide film 20. The movable electrode Em is displaceable. The base semiconductor region Bs2 is a fixed semiconductor region including a fixed electrode Es that is opposed to the movable electrode Em.

In the semiconductor device 100, capacitance is created between the opposed surfaces of the movable electrode Em and the fixed electrode Es. As the mechanical quantity is applied to the movable electrode Em, the movable electrode Em is displaced in a direction perpendicular to the opposed surfaces. The capacitance changes in accordance with a change in a distance between the opposed surfaces of the movable electrode Em and the fixed electrode Es. The change in capacitance is measured to detect the applied mechanical quantity. It is noted that, in the base substrate B4, other elements and circuits may be formed in regions other than the predetermined region R1.

The cap substrate C4 includes a single crystal silicon 30, which can be precisely processed at a relatively low cost. In the cap substrate C4, the recess 32$b$ is formed at a position corresponding to the sensing portion Se of the base substrate B4. An insulating layer 32$a$ is formed on a lower surface of the single crystal silicon substrate 30 bonded to the base substrate B4. The insulating layer 32$a$ is, for example, made of silicon oxide ($SiO_2$).

In the semiconductor device 100, as described above, the base substrate B4 and the cap substrate C4 are bonded to each other through the bonding surface D1. In a semiconductor device having a cap substrate as the semiconductor device 100, the cap substrate is generally employed to protect various elements formed in a surface layer of a base substrate.

In the semiconductor device having the cap substrate, as a method of forming an electrical connection between the various elements formed in the surface layer of the base substrate and external parts, it may be possible to directly connect a bonding wire to a surface of, the base substrate by a wire bonding technique through a through hole formed in the cap substrate.

In such a method, however, the through hole of the cap substrate needs to be large enough to allow the wire bonding. Thus, an area for making the electrical connection is likely to increase.

In order to ease the electrical connection with a small area, a semiconductor device having a cap substrate needs a leading electrode that extends from the surface of a base substrate to an upper surface of the cap substrate to allow the electrical connection with an external part at an upper end thereof.

The semiconductor device 100 has a leading electrode De1 that extends from the surface of the base substrate B4 to an upper surface of the cap substrate C4 for facilitating an electrical connection between the mechanical quantity sensor element of the base substrate B4 and the external part.

The leading electrode De1 includes a metal part 40 made of metal such as aluminum (Al), copper (Cu), chrome (Cr) tungsten (W), and platinum (Pt). A lower end of the leading electrode De1 is connected to a predetermined base semiconductor region Bs. The leading electrode De1 extends from the predetermined base semiconductor region Bs to the upper surface of the cap substrate C4, while passing through the cap substrate C4. Here, "extending to the upper surface of the cap substrate C4" means that an upper end of the leading electrode De1 is located adjacent to the upper surface of the cap substrate C4. For example, the upper end of the leading electrode De1 is located at the same height as or higher than the upper surface of the cap substrate C4.

A groove 35 is formed on a periphery of the leading electrode De1. In other words, the groove 35 is formed between an outer surface of the leading electrode De1 and the cap substrate C4. The leading electrode De1 is separated from the cap substrate C4 by the groove 35. FIG. 1B shows a condition where a bonding wire 60 is connected to the upper end of the leading electrode De1.

In the semiconductor device 91 of FIG. 30, the silicon cap substrate C2 is divided into partial regions Ce through the insulating and separating trench 31, and predetermined conductive regions Ce1, Ce1 of the partial regions Ce, which connect to the insulated and separated base semiconductor region Bs, are used as the leading conductive regions to make electrical connections at the upper end thereof with the external parts by wire bonding, soldering or the like.

In the semiconductor device 92 of FIG. 31, the penetrating electrodes Ke, which are provided by portions of the silicon cap substrate C3 and separated through the grooves 15, are used to make electrical connections at the upper end thereof with the external parts by the wire bonding, soldering or the like.

In such structures, however, since the resistance of the silicon conductive regions and the silicon penetrating electrodes Ke is large, the applicable ranges of the semiconductor devices are likely to be restricted.

In the semiconductor device 100, on the other hand, the leading electrode De1 is provided by the metal part 40, which has high electric conductivity. The metal part 40 connects to the predetermined base semiconductor region Bs, that is, at a bonding portion Des shown by a dashed line in FIG. 2. The metal part 40 passes through the cap substrate C4, and the upper end of the metal part 40 is located higher than the upper surface of the cap substrate C4. Therefore, the resistance of the leading electrode De1 is smaller than the resistance of the conductive regions Ce1, Ce2 and the penetrating electrodes Ke of the semiconductor devices 91, 92, which utilize portions of the silicone cap substrates C2, C3. Accordingly, the applicable range of the semiconductor device 100 increases.

Further, the groove 35 is provided between the leading electrode De1 and the cap substrate C4. That is, the leading electrode De1 has a so-called air isolation structure. The cap substrate C4 of the semiconductor device 100 does not have the insulating and separating trench 31 for forming the partial regions Ce as the semiconductor device 91.

In the semiconductor device 100, therefore, parasitic capacitance will not be easily formed due to the electric substance such as the insulating and separating trench 31. Further, since the groove 35 is formed around the leading substrate de1, stress due to a thermal expansion difference between the leading electrode De1 and the cap substrate C4 can be reduced.

In the semiconductor device 92 of FIG. 31, since the groove 15 is formed around the penetrating electrode Ke, the parasitic capacitance will not be easily formed. In the semiconductor device 92 of FIG. 31, the groove 15 reaches the base substrate B3. In the semiconductor device 100 of FIGS. 1A and 1B, on the other hand, the insulating layer 32a is formed under the groove 35, and thus the groove 35 does not reach the base substrate B4.

In view of reducing the parasitic capacitance, the groove 15 passing through the cap substrate C3 and reaching the base substrate B3 is preferable as in the semiconductor device 92 of FIG. 31. Thus, it may be possible to form the groove 35 to reach the base substrate B4 in the semiconductor device 100.

In the semiconductor device 100, however, the insulating layer 32a is positioned at the bottom of the groove 35. That is, the insulating layer 32a is exists around the base of the leading electrode De1. Therefore, the insulating layer 32a serves as a support portion to increase the strength of the leading electrode De1, which is particularly required during the wire bonding or soldering the upper end of the leading electrode De1.

In the example shown in FIG. 1B, the upper end of the leading electrode De1 is located higher than the upper surface of the cap substrate C4. As compared with a case where the upper end of the leading electrode De1 is at the same height as or lower than the upper surface of the cap substrate C4, interference with peripheral portions is reduced. Therefore, the wire bonding and the soldering are easily conducted at the upper end of the leading electrode De1.

Accordingly, in the semiconductor device 100, the resistance of the leading electrode De1 is reduced and the parasitic capacitance will not be easily formed around the leading electrode De1.

As described above, the cap substrate C4 is provided by the single crystal silicon substrate 30, which is easily processed at a relatively low cost. Further, since the leading electrode De1 is constructed of the metal part 40, the cap substrate C4 can be provided by a poly crystal substrate, an intrinsic silicon substrate in which glass and impurities are not doped, or other similar insulating substrates, in place of the single crystal silicon substrate.

Next, a method of manufacturing the semiconductor device 100 will be described.

Figure 3A:
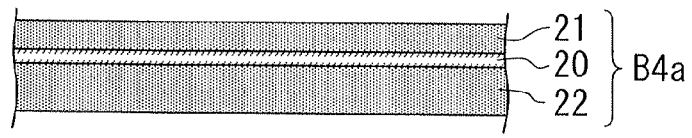
FIGS. 3A to 3C are schematic cross-sectional views for showing a process of forming the base substrate shown in FIG. 2.
Figure 3B:
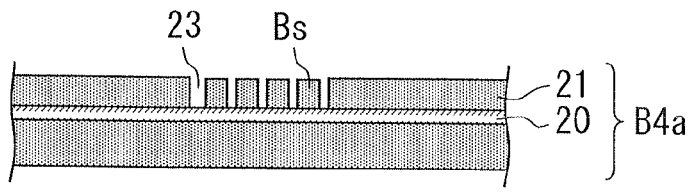
Figure 3C:
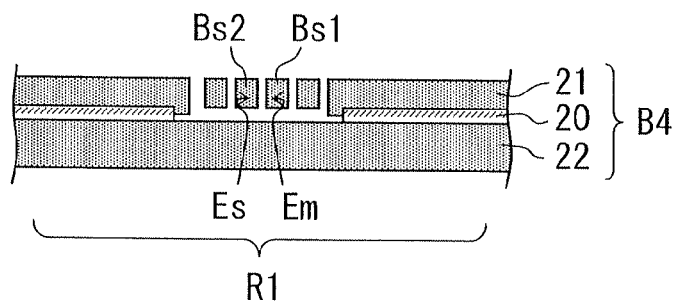

FIGS. 3A-3C are schematic cross-sectional views for showing a process of forming the base substrate B4.

In FIG. 3A, a SOI substrate B4a including the embedded oxide film 20 between the SOI layer 21 and the support substrate 22 is prepared. The SOI substrate B4a is formed by a substrate bonding technique, for example. The embedded oxide film 20 is a silicon oxide ($SiO_2$) film, and the support substrate 22 is a single crystal silicon substrate having a specific resistance in a range of 0.001 to 1 Ωcm, for example.

The SOI layer 21 is used for forming various elements. The SOI layer 21 is a single crystal silicon layer containing N+ type impurities such as arsenic (As) and phosphorous (P) with a specific resistance of 0.001 to 10 cm and a thickness of 1 to 50 μm. For example, the SOI layer 21 has a thickness of 10 to 20 μm, and the SOI layer 21 and the support substrate 22 are formed by bonding N+ type single crystal substrates containing impurities at high concentrations.

In the case where the base semiconductor regions Bs are partly used as the movable semiconductor region Bs1 including the movable electrode Em and the fixed semiconductor region Bs2 including the fixed electrode Es, it is preferable that the concentration of impurities of the SOI layer 21 is as high as possible, that is, the specific resistance of the SOI layer 21 is as small as possible. In the above-described example, the SOI layer 21 contains the N+ type impurities. As another example, all the impurities can be P+ type impurities, such as born (B).

In FIG. 3B, a mask pattern (not shown) of such as a photoresist and an oxide film is formed on the SOI layer 21. A trench 23 that has substantially perpendicular walls and reaches the oxide film 20 is formed by photolithography and deep-etching techniques. By the trench 23, the SOI layer 21 is divided to form the multiple base semiconductor regions Bs, which are insulated and separated from adjacencies, in a surface layer of the SOI substrate B4a.

In FIG. 3C, after the mask pattern is removed from the SOI layer 21, the embedded oxide film 20 is partly removed through the trench 23 by an etching technique with hydrogen fluoride (HF) gas. Thus, the movable semiconductor region Bs1 including the movable electrode Em, the fixed semiconductor region Bs2 including the fixed electrode Es, and the like are formed. In this case, the portions of the oxide film 20 under the movable electrode Em and the fixed electrode Es are thoroughly removed, as shown in FIG. 3C.

In this way, the base substrate B4 for the semiconductor device 100 is formed.

Figure 4A:
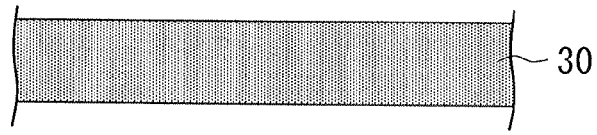
FIGS. 4A to 4C are schematic cross-sectional views for showing a process of forming a cap substrate of the semiconductor device shown in FIGS. 1A and 1B.
Figure 4B:
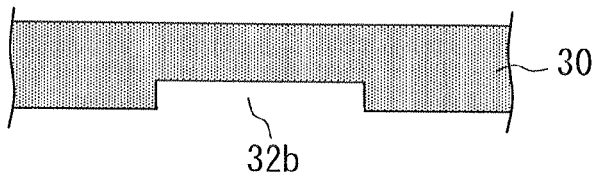
Figure 4C:
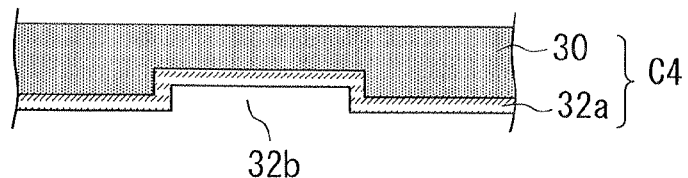

FIGS. 4A to 4C are schematic cross-sectional views for showing a process of forming the cap substrate C4.

In FIG. 4A, the single crystal silicon substrate 30 is prepared. In FIG. 4B, a mask pattern (not shown) of such as a photoresist or an oxide film is formed on a lower surface of the silicon substrate 30. Then, the recess 32b is formed by photolithography and etching techniques.

In FIG. 4C, the insulating layer 32a of the silicon oxide ($SiO_2$) is formed on the lower surface of the silicon substrate 30 by a thermal oxidation technique. In this way, the cap substrate C4 for the semiconductor device 100 is formed.

FIGS. 5A to 5D are schematic cross-sectional views for showing process of manufacturing the semiconductor device 100 using the base substrate B4 and the cap substrate C4 respectively formed by the processes shown in FIGS. 3A to 3C and FIGS. 4A to 4D.

Figure 5A:
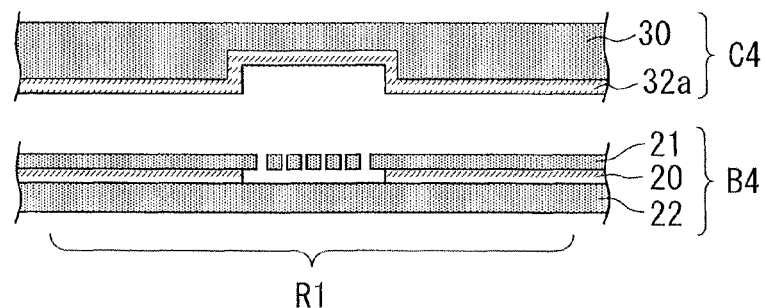
FIGS. 5A to 5D are schematic cross-sectional views for showing a process of manufacturing the semiconductor device using the base substrate and the cap substrate formed by the processes shown in FIGS. 3A to 3C and 4A to 4C.
Figure 5B:
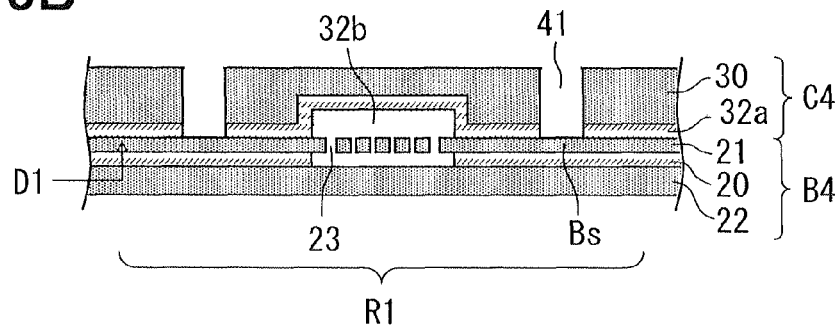

As shown in FIGS. 5A and 5B, the base substrate B4 and the cap substrate C4 are bonded to each other.

Specifically, in FIG. 5A, the cap substrate C4 is positioned relative to the base substrate B4 such that the cap substrate C4 is opposed to the predetermined region R1 where the mechanical quantity sensor element has been formed, and is laid on the base substrate B4.

In FIG. 5B, the lower surface of the cap substrate C4 is bonded to the upper surface of the base substrate B4. Here, the cap substrate C4 and the base substrate B4 are bonded using an arbitrary adhesive. Thus, the cap substrate C4 and the base substrate B4 are securely bonded at the bonding surface D1, and the space defined by the recess 32b and the trench 23 is fully sealed.

Figure 5C:
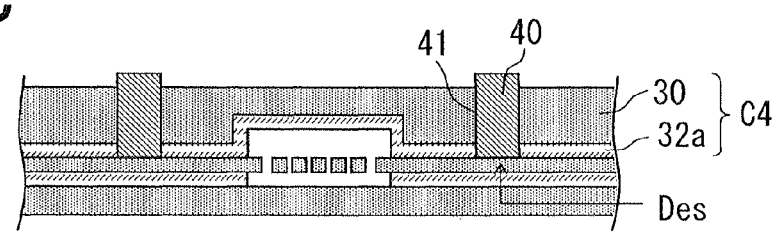
Figure 5D:
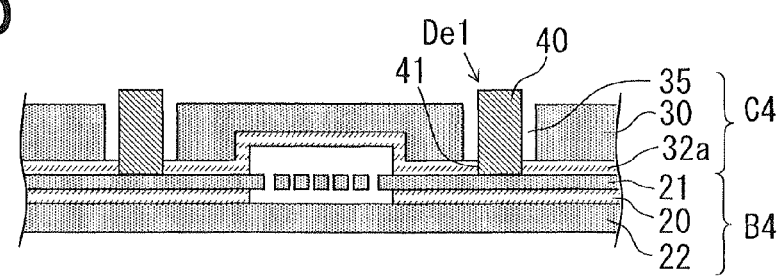

Next, the leading electrode De1 is formed, as shown in FIGS. 5B to 5D.

First, as shown in FIG. 5B, a trench 41 is formed at a predetermined position of the cap substrate C4. In this case, the trench 41 is formed to reach the predetermined base semiconductor region Bs of the base substrate B4.

In FIG. 5C, the metal part 40 is embedded in the trench 41, and then an upper surface of the cap substrate C4 is etched so that the upper end of the metal part 40 becomes higher than the upper surface of the cap substrate C4.

In FIG. 5D, a portion of the silicon substrate 30 around the trench 41 in which the metal part 40 is embedded is etched to form the groove 35 around the trench 41.

In this way, the leading electrode De1 is formed, and the semiconductor device 100 is manufactured. It is noted that, in an actual manufacturing process, the base substrate B4 and the cap substrate C4 are prepared in the condition of wafers, and the finished semiconductor devices 100 are produced by cutting the wafers into multiple chips after the process of FIGS. 5A to 5D.

Next, modifications of the leading electrode De1 and a neighboring structure thereof will be described in detail.

Figure 6A:
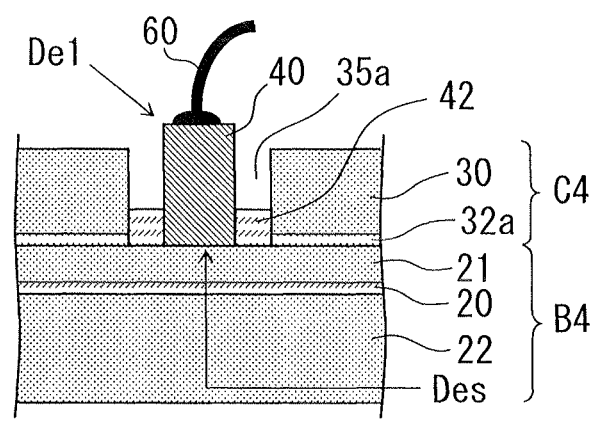
FIG. 6A is a schematic cross-sectional view of a leading electrode thereof as a modification of a leading electrode of the semiconductor device shown in FIGS. 1A and 1B.
Figure 6B:
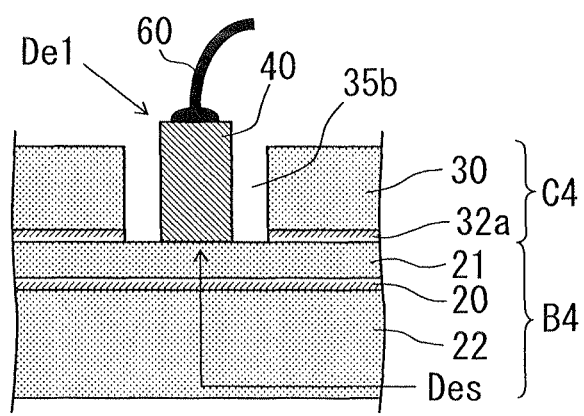
FIG. 6B is a schematic cross-sectional view of a leading electrode as another modification of the leading electrode of the semiconductor device shown in FIGS. 1A and 1B.

FIG. 6A is a schematic cross-sectional view of the leading electrode De1 and the neighboring structure thereof as a modification. FIG. 6B is a schematic cross-sectional view of the leading electrode De1 and the neighboring structure thereof as another modification.

In the modification shown in FIG. 6A, an insulating layer 42 is formed at the bottom portion of the groove 35a. The insulating layer 42 is separate from the insulating layer 32a, and has a thickness greater than a thickness of the insulating layer 32a. In this case, therefore, strength of the leading electrode De1 required for forming the electrical connection to the external part, that is, for conducting the wire bonding and the soldering, can be increased, as compared with a structure shown in FIG. 1B.

In the modification shown in FIG. 6B, a groove 35b is formed around the leading electrode De1. The groove 35b reaches the base substrate B4, similar to the structure around the penetrating electrode Ke of the semiconductor device 92 shown in FIG. 31. In this case, therefore, parasitic capacitance due to the leading electrode De1 can be further reduced, as compared with the structures shown in FIGS. 1B and 6A.

FIGS. 7A to 7D and 8A to 8D are schematic cross-sectional views for showing a process of forming the structures shown in FIGS. 6A and 6B. The process shown in FIGS. 7A to 7D and 8A to 8D is performed after the base substrate B4 and the cap substrate C4 are bonded in the manner shown in FIGS. 5A and 5B.

Figure 7A:
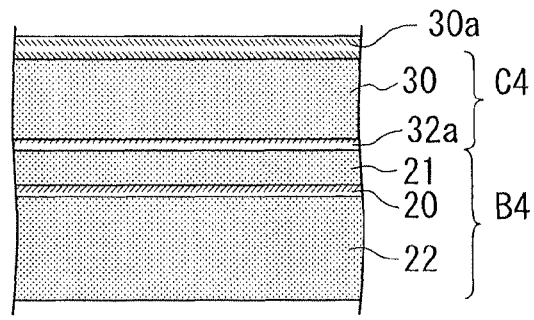
FIGS. 7A to 7D and 8A to 8D are schematic cross-sectional views for showing a process of forming the leading electrodes shown in FIGS. 6A and 6B.

In FIG. 7A, a silicon nitride ($Si_3N_4$) film 30a is formed on the single crystal silicon substrate 30 of the cap substrate C4 by a low pressure chemical vapor deposition (LPCVD) technique or a plasma chemical vapor deposition (CVD) technique. The silicon nitride film 30a can be formed on the single crystal silicon substrate 30 before the cap substrate C4 is bonded to the base substrate B4.

Figure 7B:
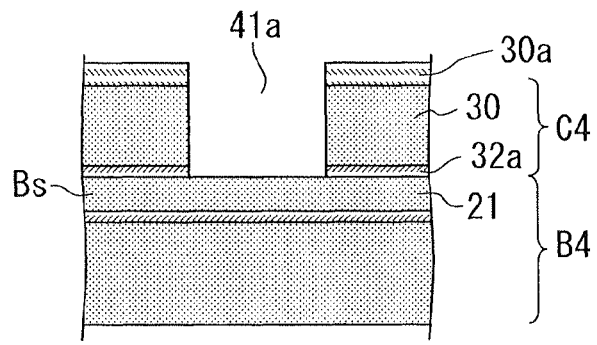

In FIG. 7B, a mask pattern (not shown) of a photoresist is formed on the silicon nitride film 30a, and then a trench 41a is formed at a predetermined position of the cap substrate C4 by etching from the top of the silicon nitride film 30a. The trench 41a is formed to reach the predetermined base semiconductor region Bs.

Figure 7C:
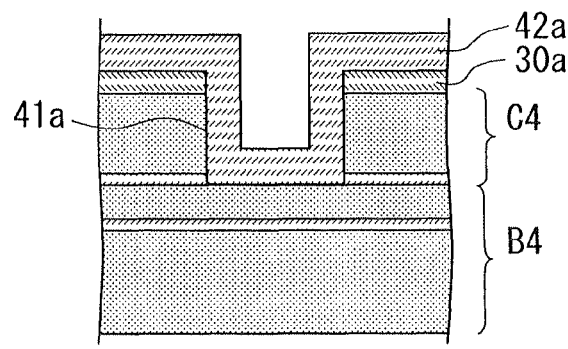

In FIG. 7C, a silicon oxide film 42a is deposited on an entire surface, that is, on the silicon nitride film 30a and walls of the trench 42a by a plasma CVD technique.

Figure 7D:
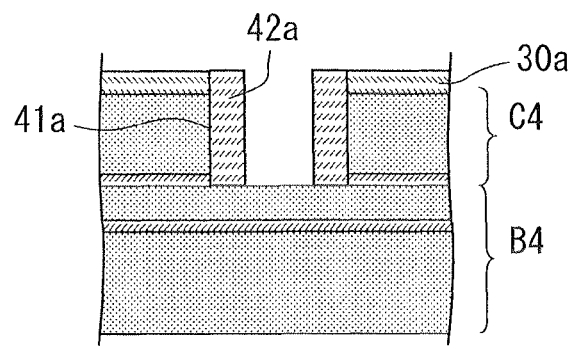

In FIG. 7D, the silicon oxide film 42a formed on the silicon nitride film 30a and the bottom wall of the trench 41a is removed. Thus, the silicon oxide film 42a on the side wall of the trench 41a remains.

Figure 8A:
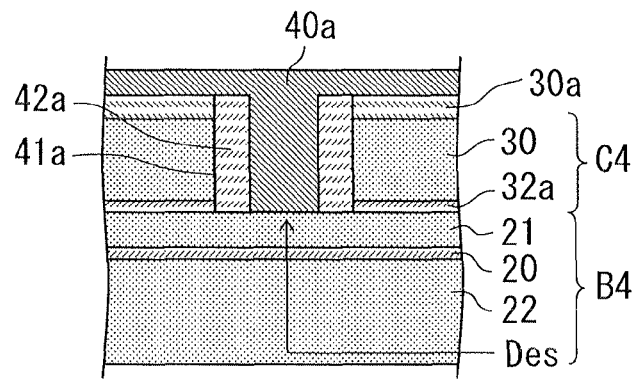

Next, in FIG. 8A, a metal layer 40a, which is for example made of aluminum (Al), is deposited on an entire surface, that is, on the silicon nitride film 30a and inside of the trench 41a. The trench 41a is filled with the metal layer 40a.

Figure 8B:
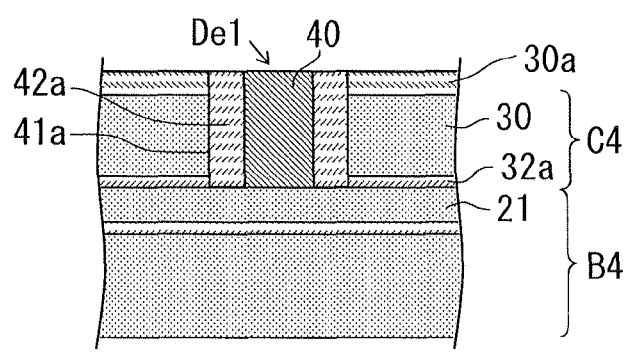

In FIG. 8B, the metal layer 40a on the silicon nitride film 30a is removed by an etchback technique. Thus, the metal layer 40a inside of the trench 41a remains to form the metal part 40 of the leading electrode De1 of FIGS. 6A and 6B.

Figure 8C:
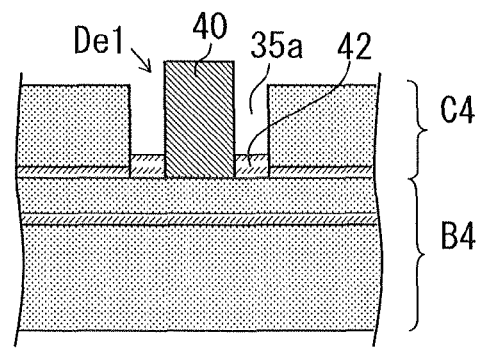

In FIG. 8C, the groove 35a is formed by removing the silicon oxide film 42a formed on the side wall of the trench 41a. The silicon oxide film 42a remains at a lower portion of the groove 35a. Thus, the insulating layer 42 shown in FIG. 6A is formed.

In this way, the leading electrode De1 and its neighboring portion shown in FIG. 6A are formed.

Figure 8D:
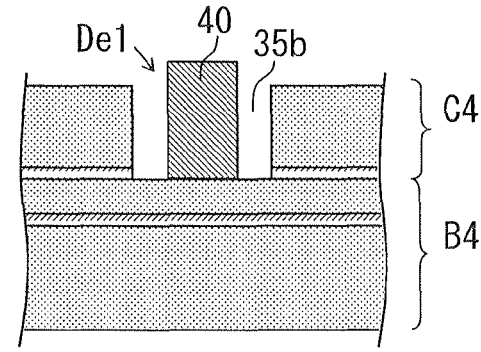

The leading electrode De1 and its neighboring portion shown in FIG. 6B are formed by entirely removing the silicon oxide film 42a from the side walls of the trench 41a, as shown in FIG. 8D.

As described in the above, after a bonding step shown in FIG. 7A, trench forming step for forming the trench 41a in the cap substrate C4 to reach the predetermined base semiconductor region Bs is performed. In a subsequent leading electrode forming step, the meal layer 40a is embedded in the trench 41a to form the metal part 40 of the leading electrode De1. Then, the groove 35a, 35b is formed at portions of the trench 41a.

Figure 9A:
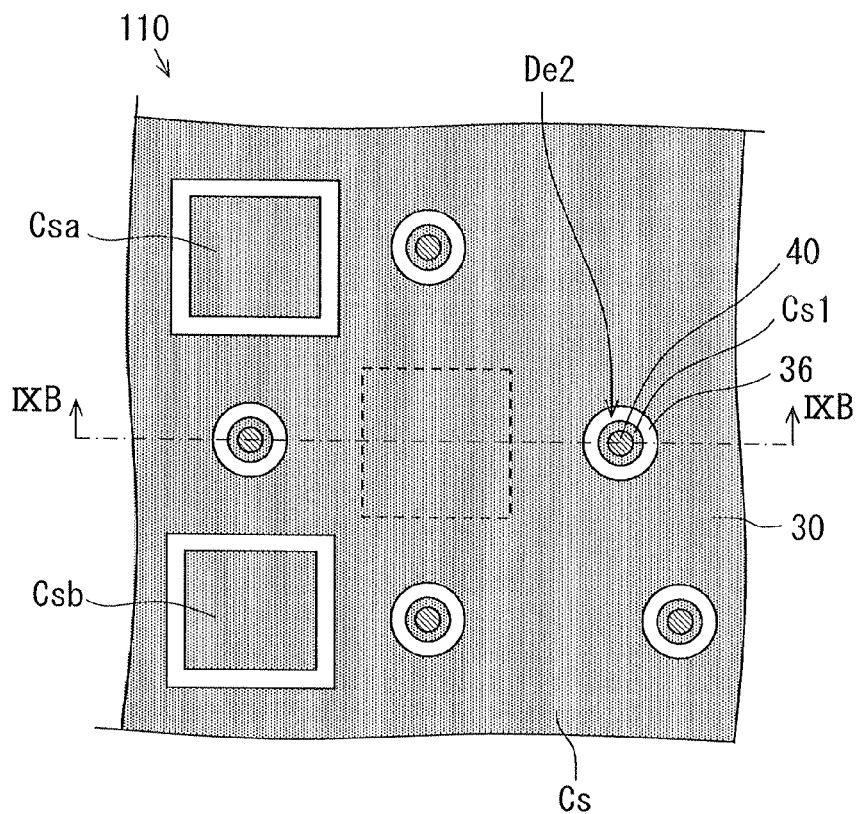
FIG. 9A is a schematic cross-sectional view of a part of a semiconductor device as a modification of the semiconductor device shown in FIGS. 1A and 1B.
Figure 9B:
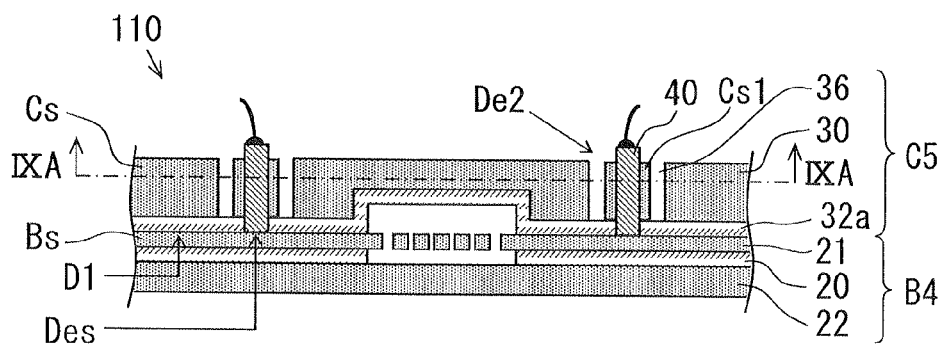
FIG. 9B is a schematic cross-sectional view taken along a line IXB-IXB in FIG. 9A.

FIG. 9A is a schematic plan view of a part of a semiconductor device 110 as a modification of the semiconductor device 100 shown in FIGS. 1A and 1B. FIG. 9B is a schematic cross-sectional view taken along a line IXB-IXB in FIG. 9A. FIG. 9A is also a schematic cross-sectional view taken along a line IXA-IXA in FIG. 9B. In the semiconductor device 110 shown in FIGS. 9A and 9B, like parts are denoted by like reference characters as those of the semiconductor device 100 shown in FIGS. 1A and 1B.

As shown in FIGS. 9A and 9B, the semiconductor device 110 has the same base substrate B4 as that of the semiconductor device 100 of FIGS. 1A and 1B. With regard to a cap substrate C5 of the semiconductor device 110, a leading electrode De2 and its neighboring structure are different from the leading electrode De1 and its neighboring structure of the cap substrate C4 of the semiconductor device 100.

The leading electrode De1 of the semiconductor device 100 is constructed of only the metal part 40. Further, although the groove 35 is formed between the cap substrate C4 and the leading electrode De1, the cap substrate C4 is constructed of a single member, that is, the silicon substrate 30.

With regard to the cap substrate C5 of the semiconductor device 110, on the other hand, a groove 36 is formed in the single crystal silicon substrate 30 to divide the single crystal silicon substrate 30 into a portion surrounding the leading electrode De2 and its peripheral portion. That is, the cap substrate C5 is divided into multiple partial regions Cs by the grooves 36. The partial regions Cs are insulated and separated by the grooves 36. The leading electrode De2 is constructed of a predetermined partial region Cs1 and the metal part 40 formed in the predetermined partial region Cs1.

Similar to the semiconductor device 100 of FIGS. 1A and 1B, the leading electrode De2 of the semiconductor device 110 has the metal part 40 that contacts the base semiconductor region Bs and extends to the upper surface of the cap substrate C5. As such, the resistance of the leading electrode De2 is reduced, as compared with that in the semiconductor devices 91, 92 of FIGS. 30, 31. With this, the applicable range increases.

The groove 36 is formed between the leading electrode De2 and the cap substrate C5, similar to the semiconductor device 100 of FIGS. 1A and 1B. Therefore the parasitic capacitance will not be easily formed on a periphery of the leading electrode De2.

The leading electrode De2 of the semiconductor device 110 is different from the leading electrode De1 of the semiconductor device 100 since the leading electrode De2 includes the predetermined partial region Cs1 as an element in addition to the metal part 40. The predetermined partial region Cs1 is formed around the metal part 40, but is insulated and separated from the adjacent partial portion Cs by the groove 36.

In the semiconductor device 110, therefore, the resistance can be reduced by the metal part 40 as the element of the leading electrode De2. Furthermore, because the predetermined partial region Cs1 around the metal part 40 serves as a support part, strength of the leading electrode De2 required at the time of wire bonding and soldering can be increased.

In the case where the cap substrate C5 is divided into multiple partial regions Cs, which are insulated and separated from each other, as the semiconductor device 110, integrated circuits (IC circuits) can be formed in other partial regions Csa, Csb of the partial regions Cs, as shown in FIG. 9A.

Figure 10A:
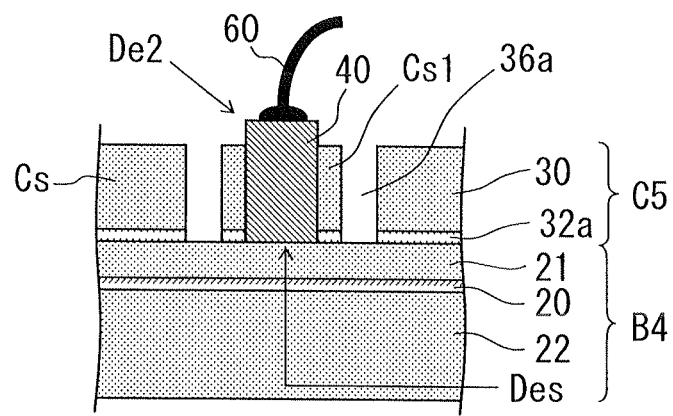
FIG. 10A is a schematic cross-sectional view of a leading electrode as a modification of a leading electrode of the semiconductor device shown in FIGS. 9A and 9B.
Figure 10B:
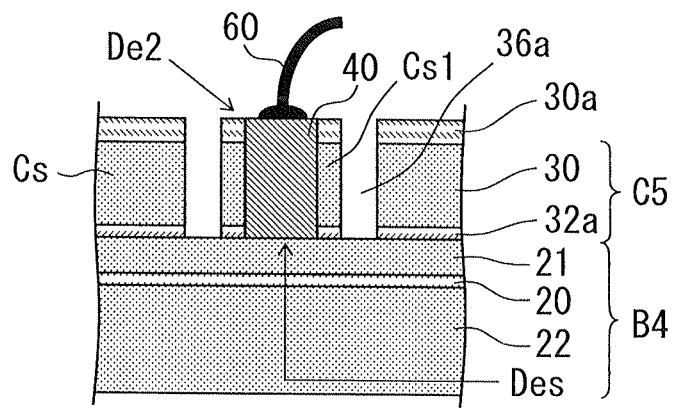
FIG. 10B is a schematic cross-sectional view of a leading electrode as a modification of the leading electrode of the semiconductor device shown in FIGS. 9A and 9B.

FIGS. 10A and 10B are schematic cross-sectional views of the leading electrode De2 and the neighboring portion thereof as modifications of the structure shown in FIGS. 9A and 9B.

In the modification shown in FIG. 10A, a groove 36a is formed to pass through the cap substrate C5 and reach the base substrate B4, similar to the groove 35b shown in FIG. 6B. Therefore, in the structure shown in FIG. 10A parasitic capacitance due to the leading electrode De2 is further reduced, as compared with the structure shown in FIGS. 9A and 9B.

In the modification shown in FIG. 10B, the silicon nitride film 30a remains, which has been formed at the beginning of the forming of the leading electrode De2 as shown in FIG. 7A, on the single crystal silicon substrate 30. Further, the upper end of the metal part 40 is on the same height as the upper surface of the silicon nitride film 30a. That is, the silicon nitride film 30a is formed above the predetermined partial region Cs1 formed around the metal part 40, and the upper surface of the silicon nitride film 30 is coplanar with the upper surface of the metal part 40.

In such a structure, because the silicon nitride film 30a serves as a support portion, strength of the leading electrode De2 required at the time of wire bonding and soldering is increased, as compared with that of the leading electrode shown in FIG. 10A.

FIGS. 11A to 11D are schematic cross-sectional views for showing a process of forming the leading electrode De2 and its neighboring structure shown in FIG. 10B.

Figure 11A:
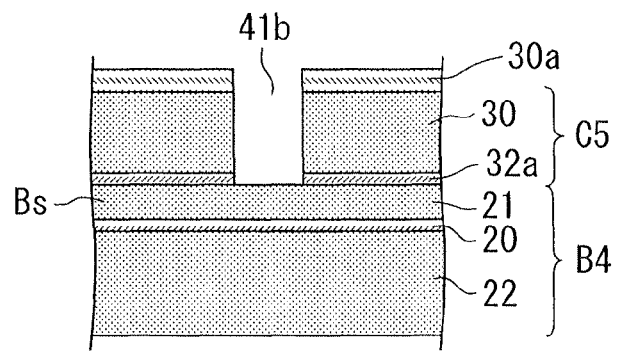
FIGS. 11A to 11D are schematic cross-sectional views for showing a process of forming the leading electrode shown in FIG. 10B.

The process begins from the similar condition shown in FIG. 7A after the base substrate B4 and the cap substrate C5 are bonded. As shown in FIG. 11A, a mask pattern (not shown) of a photoresist is formed on the silicon nitride film 30a, and then a trench 41a is formed at a predetermined position of the cap substrate C5 by etching from the top of the silicon nitride film 30a. The trench 41a is formed to reach the predetermined base semiconductor region Bs.

Figure 11B:
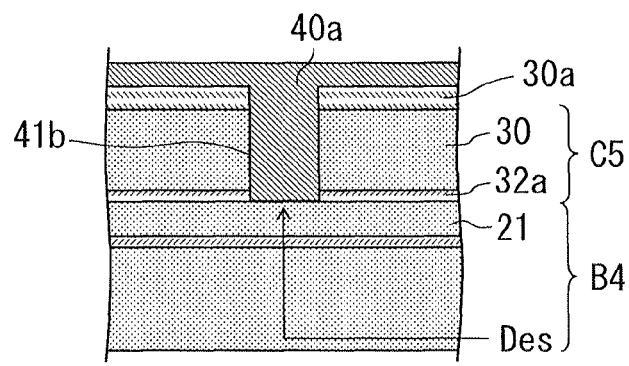

In FIG. 11B the metal layer 40a is deposited on an entire surface, that is, over the silicon nitride film 30a and inside of the trench 41a. Thus, the trench 41b is filled with the metal layer 40a.

Figure 11C:
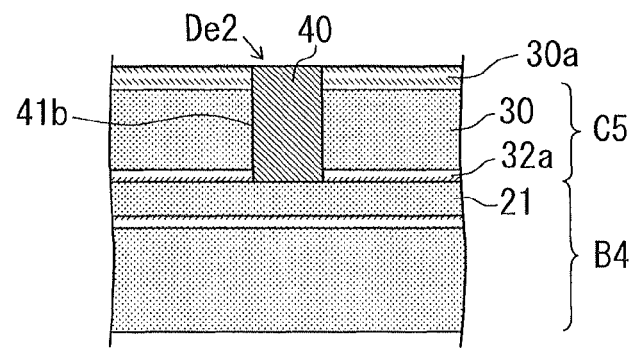

In FIG. 11C, the metal layer 40a above the silicon nitride film 30a is removed by an etchback technique. The metal layer 40a inside of the trench 41b remains to form the metal part 40 of the leading electrode De2 shown in FIG. 10B.

Figure 11D:
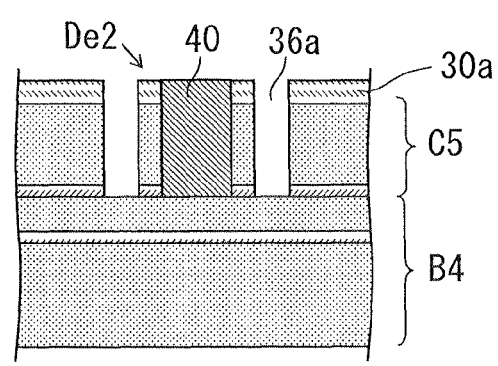

In FIG. 11D, a mask pattern (not shown) of a photoresist is formed on the silicon nitride film 30a, and the groove 36a is formed by etching from the top of the mask pattern.

In this way, the leading electrode De2 and its neighboring structure shown in FIG. 10B are formed. It is noted that the leading electrode De2 and its neighboring structure shown in FIG. 10A are formed by removing the silicon nitride film 30a after the step shown in FIG. 11D. It is also noted that the leading electrode De2 and its neighboring structure shown in FIG. 9B are formed by forming the groove 36a while remaining the insulating layer 32a at the bottom of the groove 36a in the step of FIG. 11D and further removing the silicon nitride film 30a after the step of FIG. 11D.

Figure 12A:
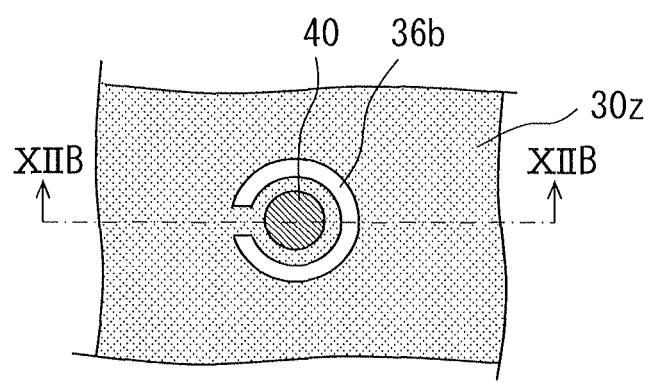
FIG. 12A is a schematic cross-sectional view of a leading electrode as further another modification of the leading electrode of the semiconductor device shown in FIGS. 9A and 9B.
Figure 12B:
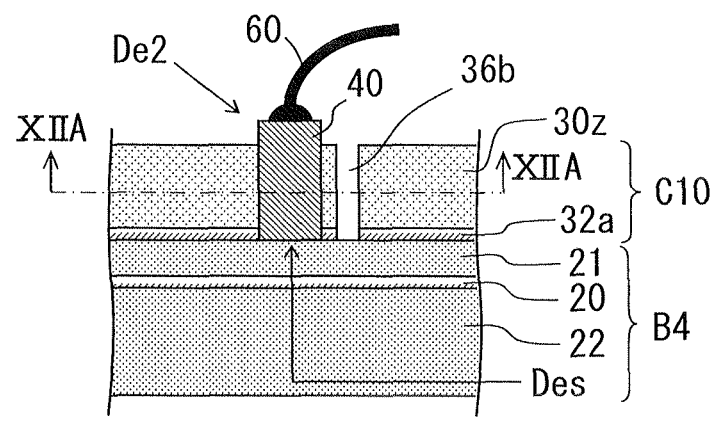
FIG. 12B is a schematic cross-sectional view taken along a line XIIA-XIIA in FIG. 12A.

FIG. 12A is a plan view of the leading electrode De2 and the neighboring structure thereof as further another modification of the structure shown in FIGS. 9A and 9B. FIG. 12B is a schematic cross-sectional view taken along a line XIIB-XIIB in FIG. 12A. FIG. 12A is also a cross-section taken along a line XIIA-XIIA in FIG. 12B.

A cap substrate C10 shown in FIGS. 12A and 12B includes an insulating substrate 30z made of intrinsic silicon in which impurities are not doped. That is, the cap substrate C10 is different from the cap substrate C5 of FIGS. 9A, 9B, 10A and 10B, which includes the single crystal silicon substrate 30 in which the impurities are doped.

Further, as shown in FIG. 12A, a groove 36b having a substantially C-shape is formed around the metal part 40 of the leading electrode De2. A portion of the substrate 30z formed around the metal, part 40 is connected to an adjacent portion of the substrate 30z, that is, on a periphery of the groove 36b through an opening of the C-shape of the groove 36b.

Therefore, in the structure shown in FIGS. 12A and 12B, strength of the leading electrode De2 required at the time of wire bonding and soldering is further increased, as compared with the structures shown in FIGS. 9A, 9B and 10A. Since the substrate 30z has an insulating property, the metal part 40 of the leading electrode De2 is electrically insulated from a peripheral portion.

Figure 13A:
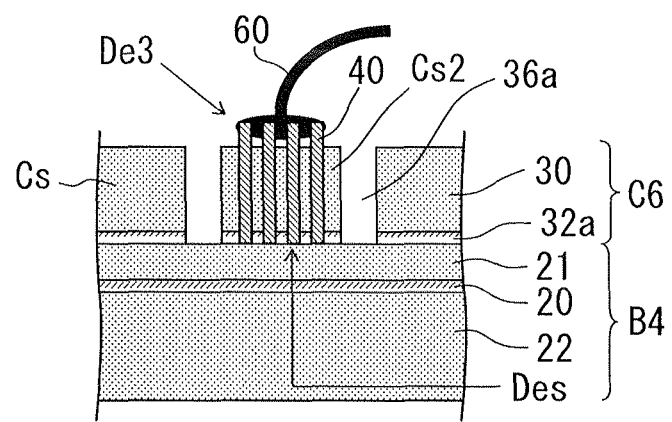
FIG. 13A is a schematic cross-sectional view of a leading electrode as yet another modification of the leading electrode of the semiconductor device shown in FIGS. 9A and 9B.
Figure 13B:
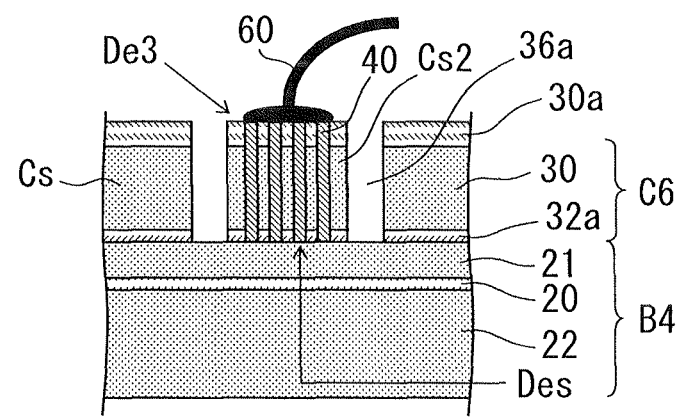
FIG. 13B is a schematic cross-sectional view of a leading electrode as still another modification of the leading electrode of the semiconductor device shown in FIGS. 9A and 9B.

FIGS. 13A and 13B are schematic cross-sectional views of a leading electrode De3 and a neighboring structure thereof as still other modifications of the structure shown in FIGS. 9A and 9B.

The leading electrodes De3 shown in FIGS. 13A and 13B are provided by subdividing the leading electrodes De2 of FIGS. 10A and 10B, respectively. That is, the metal part 40 is constructed of multiple portions in a predetermined partial region Cs2, which is one of the partial regions Cs and separated and insulated from a peripheral partial region Cs by the groove 36a.

In the structure shown in FIG. 13A, the silicon nitride film 30a formed above the single crystal silicon substrate 30 during the manufacturing process is removed. In the structure shown in FIG. 13B, the silicon nitride film 30a remains on the single crystal silicon substrate 30.

In the structures shown in FIGS. 13A and 13B, stress due to a thermal expansion difference between the metal part 40 and the partial region Cs2 made of silicon is further reduced, as compared with the structures shown in FIGS. 10A and 10B.

In the structure shown in FIG. 13A, at the time of wire bonding or soldering, the bonding wire 60 and the solder can be embedded between the divided portions of the metal part 40, which protrude higher than the upper surface of the partial region Cs2. Therefore, reliability of connection improves.

Figure 14A:
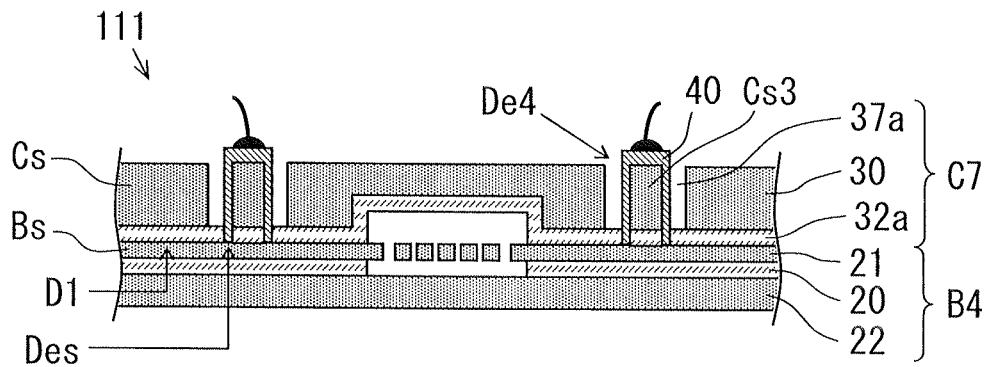
FIG. 14A is a schematic cross-sectional view of a part of a semiconductor device as a modification of the semiconductor device shown in FIGS. 9A and 9B.
Figure 14B:
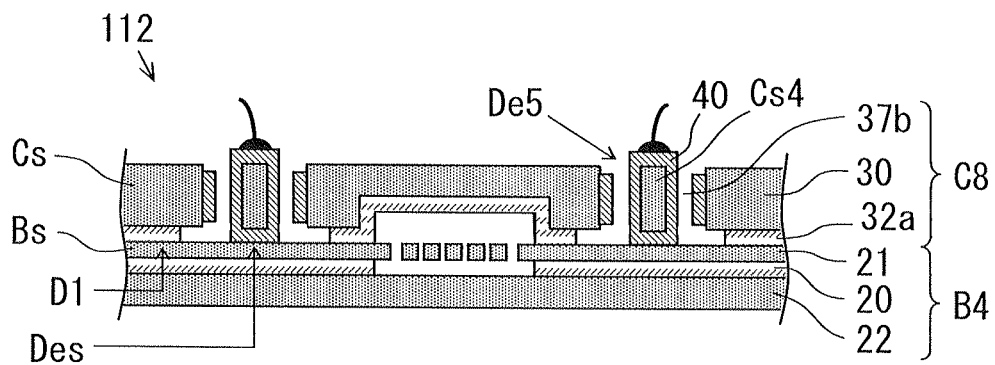
FIG. 14B is a schematic cross-sectional view of a part of a semiconductor device as another modification of the semiconductor device shown in FIGS. 9A and 9B.
Figure 14C:
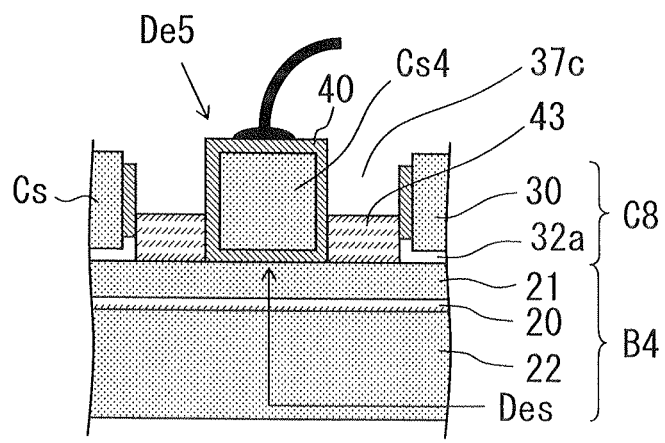
FIG. 14C is a schematic cross-sectional view of a leading electrode as a modification of a leading electrode of the semiconductor device shown in FIG. 14B.

FIG. 14A is a schematic cross-sectional view of a part of a semiconductor device 111 as a modification of the semiconductor device 110 shown in FIGS. 9A and 9B. FIG. 14B is a schematic cross-sectional view of a part of a semiconductor device 112 as another modification of the semiconductor device 110 shown in FIGS. 9A and 9B. FIG. 14C is a schematic cross-sectional view of a leading electrode De5 and its neighboring structure as a modification of a leading electrode De5 and its neighboring structure of the semiconductor device 112 shown in FIG. 14B.

The base substrates B4 of the semiconductor devices 111, 112 are the same as the base substrates B4 of the semiconductor devices 100, 110 of FIGS. 1A, 1B, 9A and 9B. The semiconductor devices 111, 112 have cap substrates C7, C8 and leading electrodes De4, De5, which have different structures from the cap substrates C5 and the leading electrode De2 of the semiconductor device 110 of FIGS. 9A and 9B.

The leading electrode De2 of the semiconductor device 110 is constructed of the predetermined partial region Cs1 and the metal part 40 formed at the center of the partial region Cs1. On the other hand, the leading electrode De4 of the semiconductor device 111 is constructed of a predetermined partial region Cs3, which is one of the partial regions Cs, and the metal part 40 that covers a side wall and an upper surface of the partial region Cs3.

That is, in the leading electrode De4 of the semiconductor device 111, since the metal part 40 covers the upper surface of the partial region Cs4, connecting area between the metal part 40 and the bonding wire or the solder is increased, as compared with the leading electrode De2 of the semiconductor device 110 shown in FIGS. 9A and 9B in which the metal part 40 does not cover the upper surface of the partial region Cs1. Therefore, the electrical connection further improves.

The leading electrode De5 of the semiconductor device 112 is constructed of the predetermined partial region Cs4 and the metal part 40 covering a lower surface of the partial region Cs4 in addition to the side wall and the upper surface of the partial region Cs4. In this case, the connection between the leading electrode De5 and the predetermined base semiconductor region Bs of the base substrate B4 further improves, as compared with the connection between the leading electrode De4 and the predetermined base semiconductor region Bs of the semiconductor device 111 shown in FIG. 14A.

The metal part 40 of the leading electrode De4 of the semiconductor device 111 connects to the base semiconductor region Bs and extends to the same height as or higher than the upper surface of the cap substrate C7. Similarly, the metal part 40 of the leading electrode De5 of the semiconductor device 112 connects to the base semiconductor region Bs and extends to the same height as or higher than the upper surface of the cap substrate C8. As such, in the semiconductor devices 111, 112, resistance of the leading electrodes De4, De5 is reduced, as compared with that of the semiconductor devices 91, 92 of FIGS. 30 and 31. Therefore, the applicable ranges of the semiconductor devices 111, 112 increase.

In addition, in the semiconductor device 111 of FIG. 14A, a groove 37a is formed between the leading electrode De4 and the cap substrate C7. Therefore parasitic capacitance will not be easily formed on a periphery of the leading electrode De4.

Likewise in the semiconductor device 112 of FIG. 14B, a groove 37b is formed between the leading electrode De5 and the cap substrate C8. Therefore, parasitic capacitance will not be easily formed on a periphery of the leading electrode De5.

In the leading electrode De5 and the neighboring structure thereof shown in FIG. 14C, a groove 37c is formed around the leading electrode De5, and an insulating layer 43, which is separate from the insulating layer 32a of the cap substrate C8, is formed at the bottom portion of the groove 37c. Therefore, strength of the leading electrode De5 of FIG. 140 required at the time of wire bonding and soldering is increased, as compared with that of the leading electrode De5 of FIG. 14B.

Figure 15A:
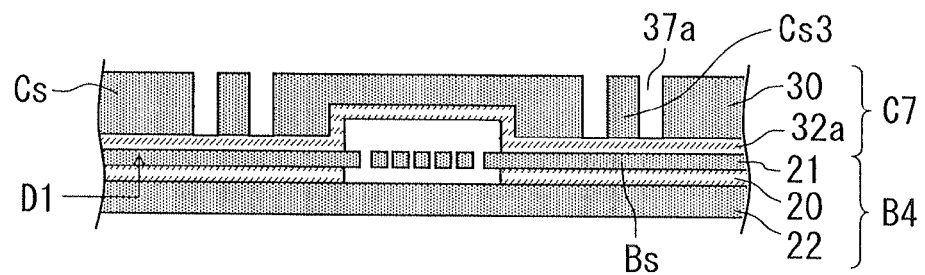
FIGS. 15A to 15C are schematic cross-sectional views for showing a process of manufacturing the semiconductor device shown in FIG. 14A.
Figure 15B:
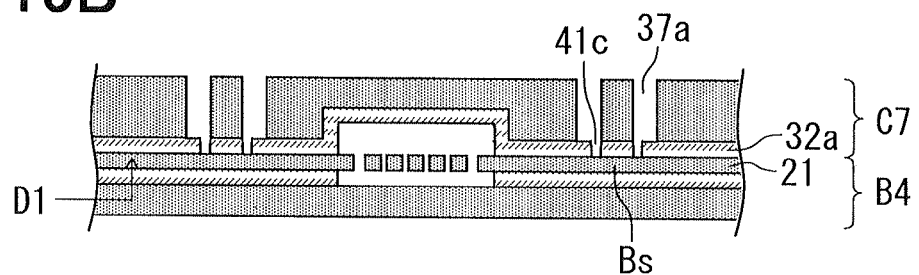
Figure 15C:
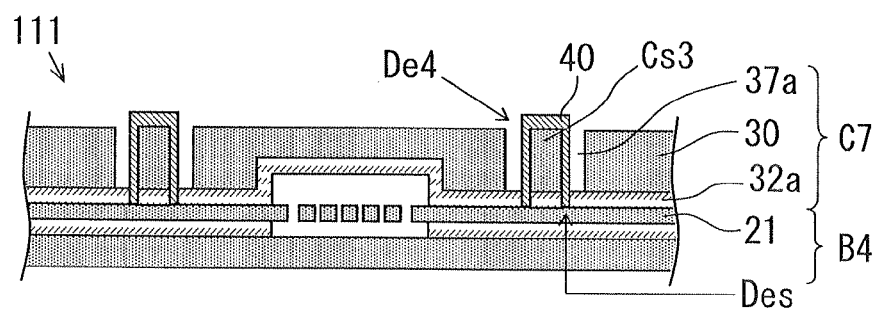

FIGS. 15A to 15C are schematic cross-sectional views for showing a process of forming the semiconductor device 111 of FIG. 14A.

In FIG. 15A, after the base substrate B4 and the cap substrate C7 are bonded to each other in a similar manner as shown in FIGS. 5A and 5B, the groove 37a is formed at a predetermined position of the cap substrate C7 to reach the insulating layer 32a. Thus, the single crystal silicon substrate 30 is divided into the partial regions Cs including a partial region Cs3.

In FIG. 15B, the insulating layer 32a at the bottom portion of the groove 37a is further etched to form a trench 41c reaching the predetermined base semiconductor region Bs of the base substrate B4.

In FIG. 15C, the metal part 40 is formed successively inside the trench 41c, on the side wall of the partial region Cs3, and on an upper surface of the partial region Cs3.

In this way, the leading electrode De4 is formed, and thus the semiconductor device 111 of FIG. 14A is manufactured.

FIGS. 16A to 16D, 17A to 17D and 18A to 180 are schematic cross-sectional views for showing a process of forming the leading electrodes De5 and neighboring structures thereof shown in FIGS. 14B and 14C.

The process of forming the leading electrode De5 of the semiconductor device 112 shown in FIG. 14B is different from the processes of forming the leading electrodes De1 to De4. To form the leading electrode De5 of the semiconductor device 112 shown in FIG. 14B necessary structures are formed in the cap substrate C8 before the base substrate B4 and the cap substrate C8 are bonded to each other.

Figure 16A:
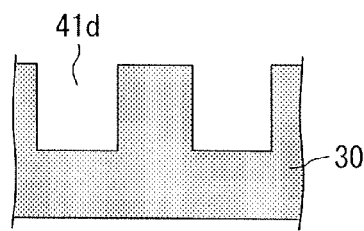
FIGS. 16A to 16D, 17A to 17D and 18A to 18C are schematic cross-sectional views for showing a process of forming the leading electrodes shown in FIGS. 14B and 14C.

In FIG. 16A, the single crystal silicon substrate 30 is prepared. A mask pattern (not shown) of a photoresist is formed on the single crystal silicon substrate 30, and then a trench 41d is formed by etching from the top.

Figure 16B:
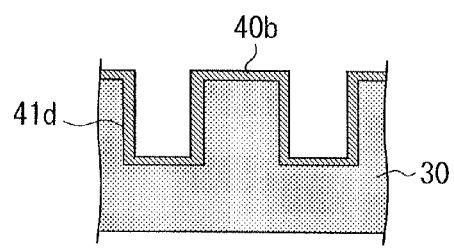

In FIG. 16B, a metal layer 40b made of such as aluminum (Al) is deposited entirely over the single crystal silicon substrate 30 including the trench 41d.

Figure 16C:
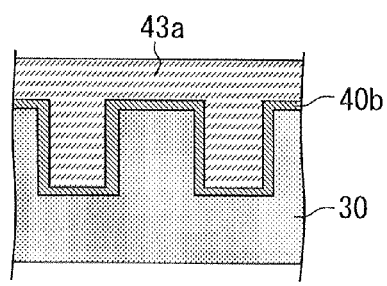

In FIG. 16C, a silicon oxide ($SiO_2$) film 43a is deposited entirely over the metal layer 40b by a plasma CVD technique.

Figure 16D:
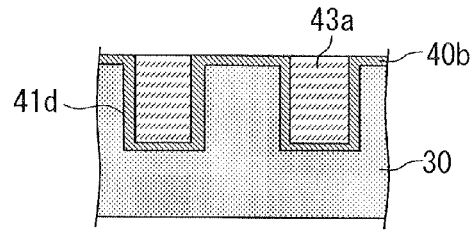

In FIG. 16D, the silicon oxide film 43a is removed by an etchback technique so that the metal layer 40b on the surface of the single crystal silicon substrate 30 exposes, and only, the silicon oxide film 43a inside of the trench 41d remains.

Figure 17A:
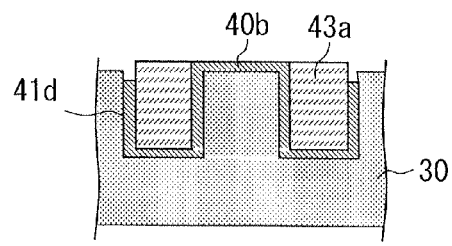

Next, in FIG. 17A, a predetermined mask pattern (not shown) is formed, and the metal layer 40b is partly removed by an etching technique.

Figure 17B:
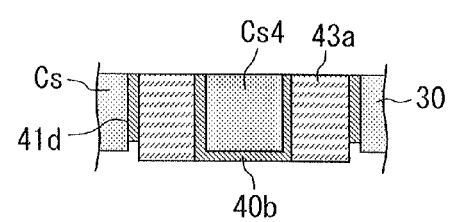

In FIG. 17B, the single crystal silicon substrate 30 is turned upside down, and then is grinded from the top so that the silicon oxide film 43a embedded inside of the trenches 41d is exposed. In this way, the single crystal silicon substrate 30 is divided to form the insulated and separated multiple partial regions Cs including a partial region Cs4.

Figure 17C:
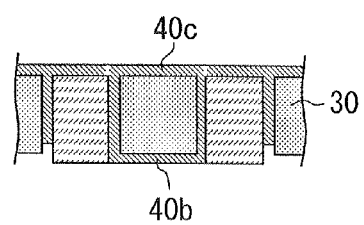

In FIG. 17C, a metal layer 40c made of such as aluminum (Al) is deposited entirely over the single crystal silicon substrate 30.

Figure 17D:
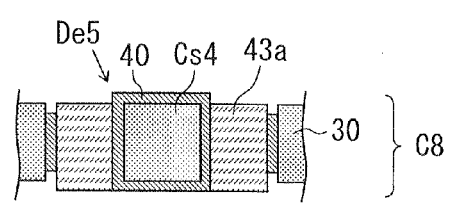

In FIG. 17D, a predetermined mask pattern (not shown) is, formed on the metal layer 40c, and then the metal layer 40c is partly removed by etching. Thus, the metal part 40 that covers the side wall, the upper surface and the lower surface of the partial region Cs4 is formed.

By the above steps, the cap substrate C8 before being bonded is formed.

Figure 18A:
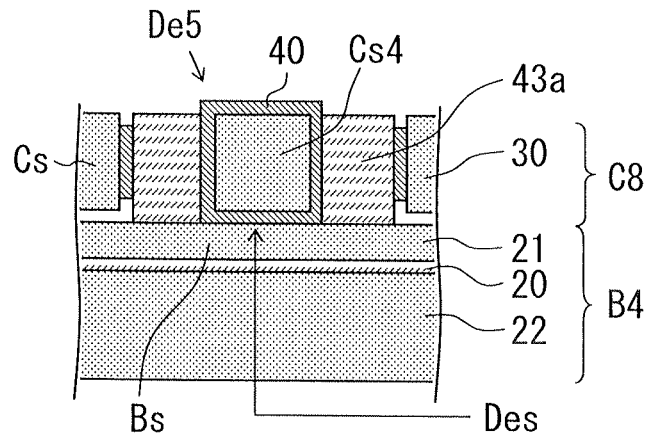

Next, in FIG. 18A, the base substrate B4 and the cap substrate C8, which have been formed beforehand, are bonded to each other.

Figure 18B:
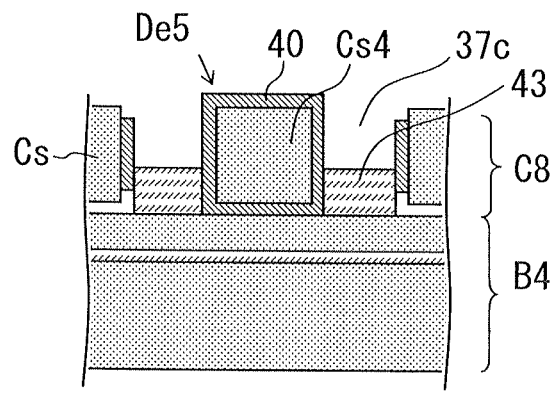

In FIG. 18B, the trench 37c is formed by etching the silicon oxide film 43a from the top. The silicon oxide film 43a remains at the bottom of the trench 37c to provide the insulating layer 43.

By the above steps, the leading electrode De5 and its neighboring structure shown in FIG. 14C are formed.

Figure 18C:
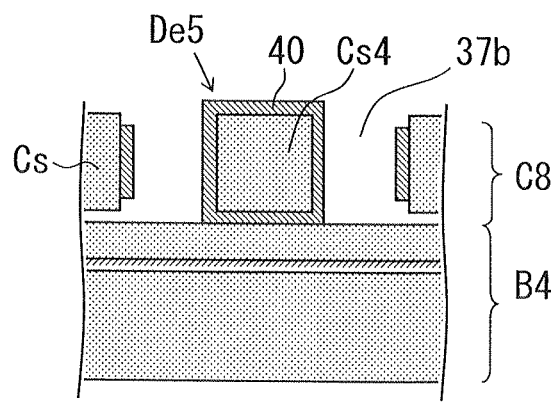

If the silicon oxide film 43a is fully removed by the etching, the groove 37b is formed as shown in FIG. 18C. Thus, the leading electrode De5 and its neighboring structure shown in FIG. 14B are formed.

As described in the above, the leading electrode forming process can be partly conducted during the cap substrate forming process. That is, the leading electrode De5 can be formed in a condition of being connected to the cap substrate C8 while the cap substrate C8 is formed. Then, the lower surface of the leading electrode De5 is connected to the predetermined base semiconductor region Bs while the cap substrate C8 is bonded to the base substrate B4. Thereafter, the grooves 37b, 37c are formed.

Figure 19A:
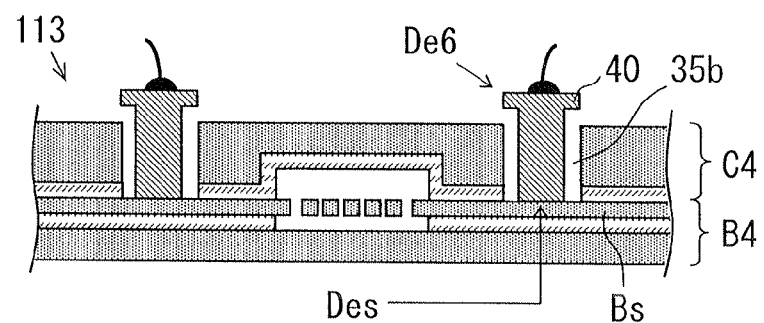
FIG. 19A is a schematic cross-sectional view of a part of a semiconductor device as a modification of the semiconductor device shown in FIGS. 1A and 1B.
Figure 19B:
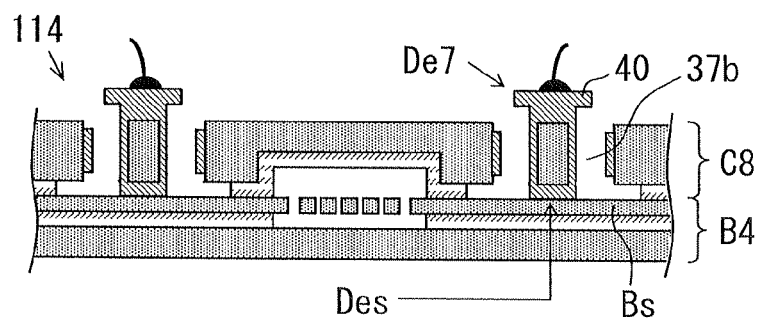
FIG. 19B is a schematic cross-sectional view of a part of a semiconductor device as another modification of the semiconductor device shown in FIG. 14B.

FIG. 19A is a schematic cross-sectional view of a part of a semiconductor device 113 as a modification of the semiconductor device 100 shown in FIGS. 1A and 1B. FIG. 19B is a schematic cross-sectional view of a part of a semiconductor device 114 as a modification of the semiconductor device 112 shown in FIG. 14B.

In the semiconductor device 113 shown in FIG. 19A, a leading electrode De6 has an upper surface to which the electrical connection is formed such as by the wire bonding and the soldering. The upper surface has an area greater than that of a lower surface, which is connected to the base semiconductor region Bs to form the bonding portion Des. Similarly, a leading electrode De1 of the semiconductor device 114 shown in FIG. 19B has an upper surface with an area greater than a lower surface thereof.

In such cases, a pad area increases, as compared with a case where the upper surface of a leading electrode has an area smaller than or the same as an area of the lower surface thereof. Therefore, the wire bonding and the soldering to the upper surface of the leading electrodes De6, De7 are easily conducted.

Figure 20A:
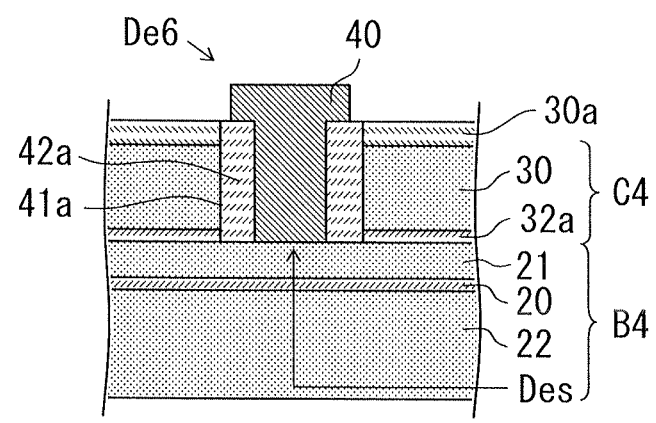
FIGS. 20A and 20B are schematic cross-sectional views for showing a process of forming a leading electrode of the semiconductor device shown in FIG. 19A.
Figure 20B:
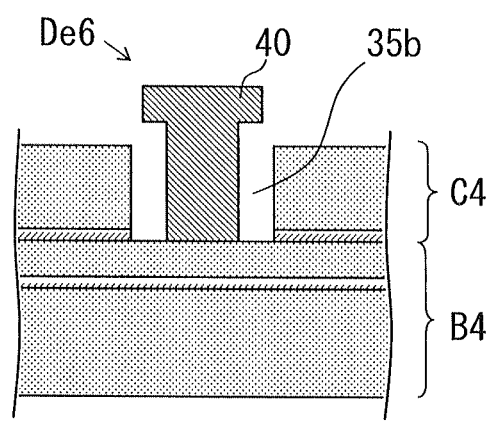

FIGS. 20A and 20B are schematic cross-sectional views for showing a process of forming the leading electrode De6 and its neighboring structure of the semiconductor device 113 shown in FIG. 19A.

As shown in FIG. 20A, the process begins from the condition shown in FIG. 8A. In FIG. 20A, the metal layer 40a formed on the silicon nitride film 30a is etched in a predetermined pattern so that the metal part 40 having the upper surface with the greater area than its lower surface is formed.

In FIG. 20B, the silicon oxide film 42a on the side wall of the trench 41a and the silicon nitride film 30a on the single crystal silicon substrate 30 are removed in a predetermined order to form the groove 35b.

In this way, the leading electrode De6 and its neighboring structure of the semiconductor device 113 shown in FIG. 19A are formed.

FIGS. 21A to 21D are schematic cross-sectional views for showing a process of forming the leading electrode De7 and its neighboring structure of the semiconductor device 114 shown in FIG. 19B.

Figure 21A:
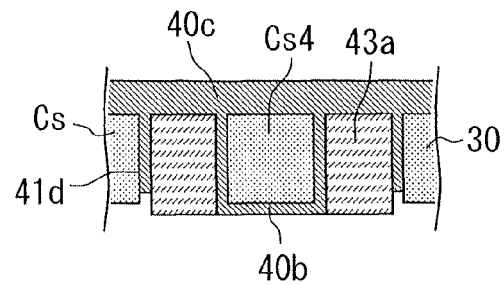
FIGS. 21A to 21D are schematic cross-sectional views for showing a process of forming a leading electrode of the semiconductor device shown in FIG. 19B.
Figure 21B:
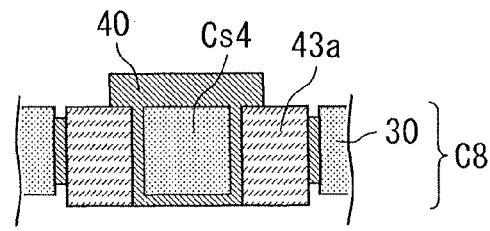

As shown in FIG. 21A, the process begins from the condition shown in FIG. 17B. In FIG. 21A, the metal layer 40c made of such as aluminum (Al) is deposited over an entire surface of the single crystal silicon substrate 30 with a thickness greater than a thickness of the metal layer 40c of FIG. 17C In FIG. 21B, the metal layer 40c is etched in a predetermined pattern. Thus, the metal part 40 having the upper surface with the greater area than that of the lower surface is formed.

Figure 21C:
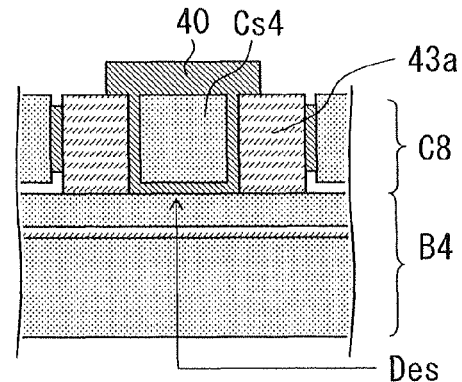

In FIG. 21C, the base substrate B4 and the cap substrate C8, which have been prepared beforehand are bonded to each other.

Figure 21D:
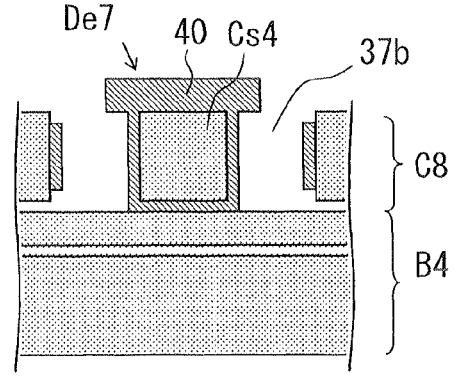

In FIG. 21D the silicon oxide film 43a is fully removed by an etching technique to form the groove 37b.

In this way, the leading electrode De1 and its neighboring structure of the semiconductor device 114 shown in FIG. 19B is formed.

Figure 22:
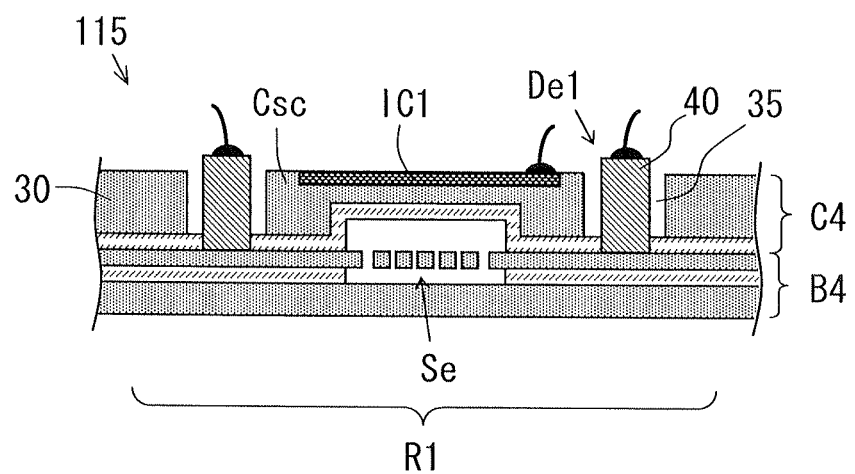
FIG. 22 is a schematic cross-sectional view of a part of a semiconductor device as further another modification of the semiconductor device shown in FIGS. 1A and 1B.

FIG. 22 is a schematic cross-sectional view of a part of a semiconductor device 115 as further another modification of the semiconductor device 100 shown in FIGS. 1A and 1B.

The semiconductor device 115 shown in FIG. 22 has an integrated circuit (IC circuit) IC1 on a partial region Csc of the single crystal silicon substrate 30 in addition to the structure of the semiconductor device 100 shown in FIG. 1B. The partial region Csc is one of the partial regions Cs of the cap substrate C4, and seals the sensing portion Se of the base substrate B4. In the case where the single crystal silicon substrate is used for the cap substrate, in this way, the integrated circuit can be formed in the predetermined partial region of the cap substrate, which is insulated and separated.

Figure 23:
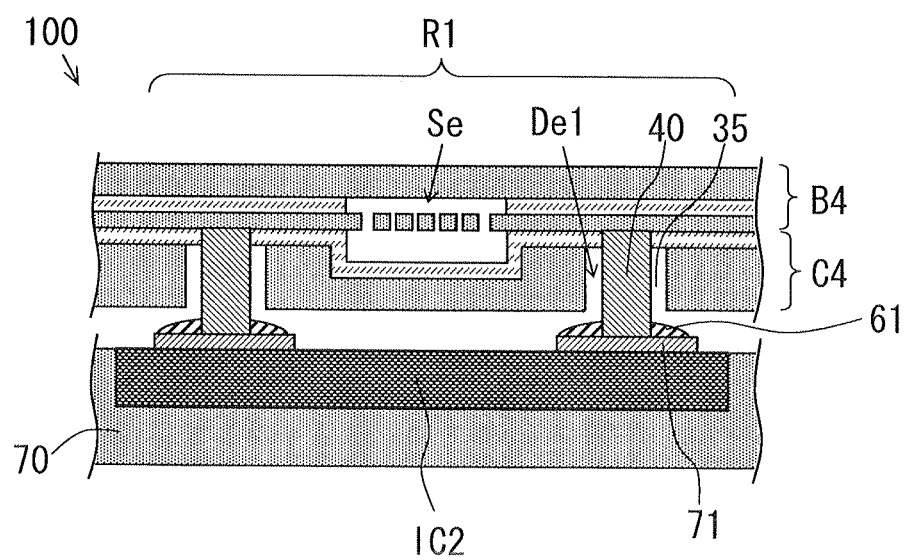
FIG. 23 is a schematic cross-sectional view of a part of a semiconductor device as an example of another use of the semiconductor device shown in FIGS. 1A and 18.

FIG. 23 is a schematic cross-sectional view of a part of the semiconductor device 100 for showing another applicable example.

In the example shown in FIG. 1B, the upper end of the leading electrode De1 is exemplarily connected to the wire bonding 60 to be electrically connected to an external part. In the example shown in FIG. 23, on the other hand, the semiconductor device 100 is mounted to a separate single crystal silicon substrate 70 having an integrated circuit (IC circuit) IC2 by a flip-chip technique. The end surfaces of the metal parts 40 constructing the leading electrodes De1 are electrically connected to pad electrodes 71 formed on the single crystal silicon substrate 70 by solders 61. In this way, the electrical connections of the end surfaces of the leading electrodes De1 to the external parts can be formed by either the wire bonding or the soldering.

Figure 24:
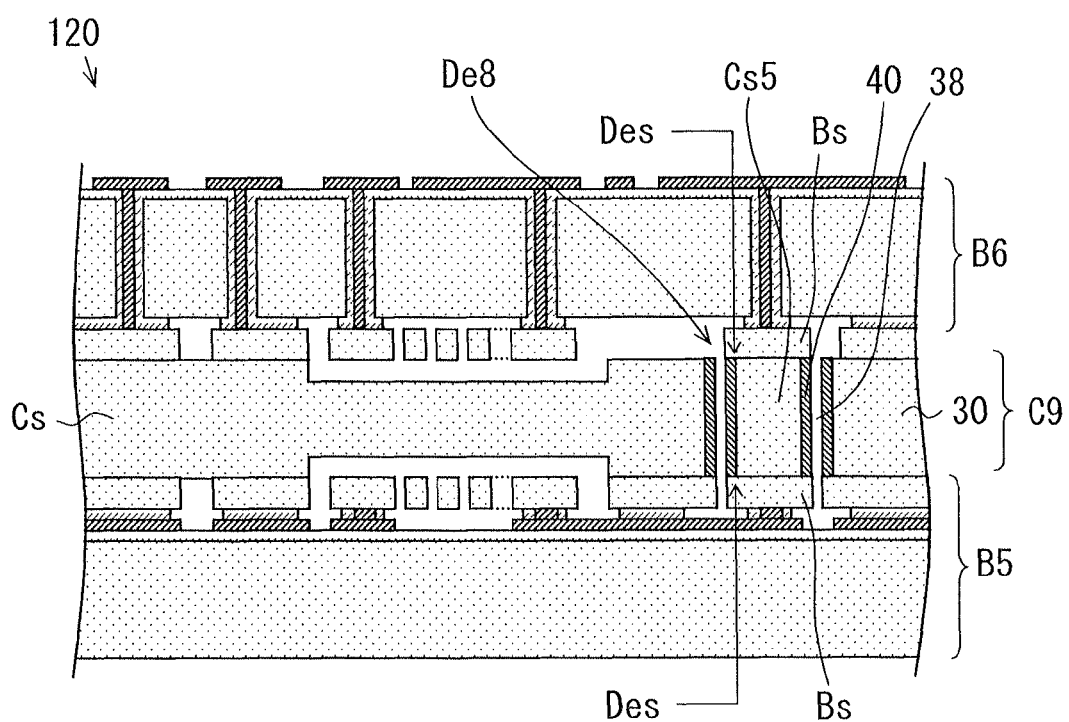
FIG. 24 is a schematic cross-sectional view of a part of a semiconductor device as an example of the semiconductor device according to the embodiment.

FIG. 24 is a schematic cross-sectional view of a part of a semiconductor device 120 as an example of the semiconductor device according to the embodiment. The semiconductor device 120 has two base substrates B5, B6 and a cap substrate C9. The base substrates B5, B6 are bonded on opposite sides of the cap substrate C9.

For example, the base substrate B5 is provided with an angular velocity sensor element (a gyro sensor element). The base substrate B6 is provided with an acceleration sensor element.

In the semiconductor device 120 shown in FIG. 24, the base substrate B5 and the second substrate B6 are electrically connected to each other through leading electrodes De8 formed in the cap substrate C9. Although the semiconductor device 120 carries the angular velocity sensor element and the acceleration sensor element, it is configured compact and wiring resistance of the semiconductor device 120 is reduced.

The cap substrate C9 has a groove 38 formed to divide the single crystal silicon substrate 30. That is, the cap substrate C9 is divided into multiple partial regions Cs, which are insulated and separated from each other, by the groove 38. The leading electrode De8 is constructed of the predetermined partial region Cs5 of the partial regions Cs and the metal part 40 formed around the partial region Cs5. For example, the metal part 40 is formed on the side wall of the partial region Cs5.

The metal part 40 connects to the base semiconductor region Bs and extends to the upper surface of the cap substrate C9. For example, both the end surfaces of the metal part 40 are on the same heights as the opposite surfaces of the cap substrate C9 and connect to the base semiconductor regions Bs of the base substrates B5, B6.

Also in such a case, resistance of the leading electrode De8 is reduced, and thus the applicable range, of the semiconductor device 120 increases. Further, the groove 38 is formed between the leading electrode De8 and the cap substrate C9. Thus, parasitic capacitance will not be easily formed on a periphery of the leading electrode De8.

FIGS. 25A to 25D and FIGS. 26A to 26C are schematic cross-sectional views for showing a process of manufacturing the semiconductor device 120 shown in FIG. 24.

Figure 25A:
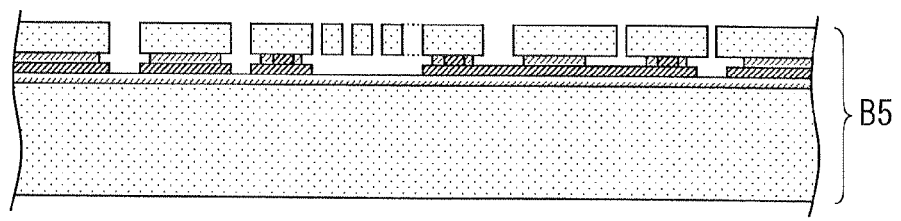
FIGS. 25A to 25D and 26A to 26C are schematic cross-sectional views for showing a process of manufacturing the semiconductor device shown in FIG. 24

In FIG. 25A, the base substrate B5 having the angular velocity sensor element is formed.

Figure 25B:
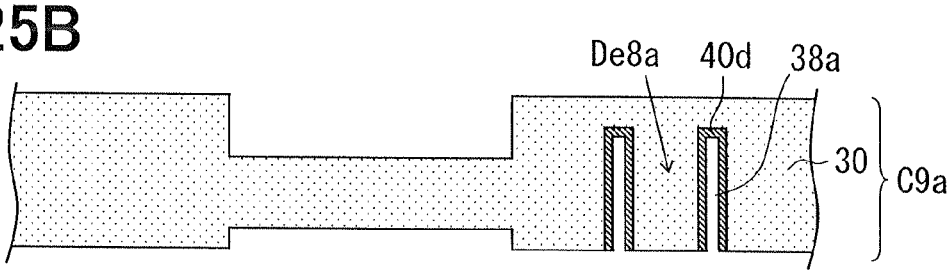

In FIG. 25B, a primary cap substrate C9a having a primary leading electrode De8a, which will be the leading electrode De8, is formed. For example, a primary groove 38a is formed in the single crystal silicon substrate 30 of the primary cap substrate C9a, and further a metal layer 40d is formed inside of the primary groove 38a.

Figure 25C:
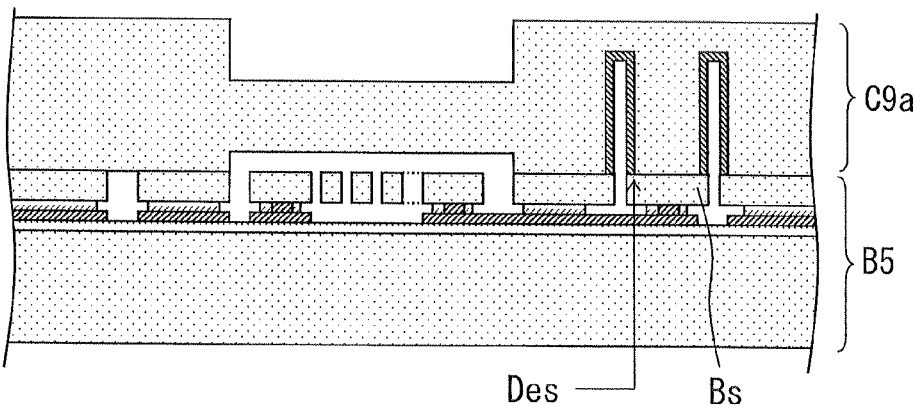

In FIG. 25C, the primary cap substrate C9a shown in FIG. 25B is bonded to the base substrate B5 shown in FIG. 25A. For example, the primary cap substrate C9a and the base substrate B5 are bonded to each other by a silicon direct bonding technique, which is conducted at a low temperature in a vacuum state.

Figure 25D:
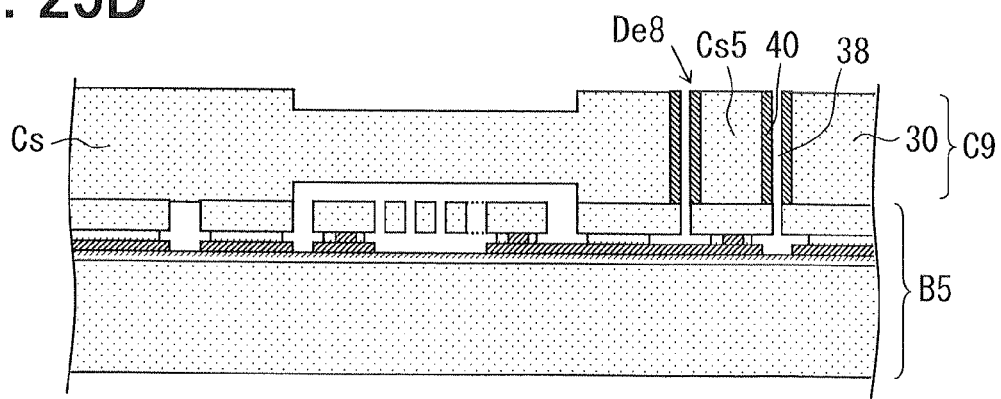

In FIG. 25D, the primary cap substrate C9a is grinded from the top to a position where the primary groove 38a penetrates through the primary cap substrate C9a. In this way, the groove 38 of the semiconductor device 120 is formed. The cap substrate C9 is provided by the primary cap substrate C9a, which is divided into the multiple partial regions Ce by the groove 38, and the metal part 40 as the element of the leading electrode De8 is provided by the metal layer 40d.

Figure 26A:
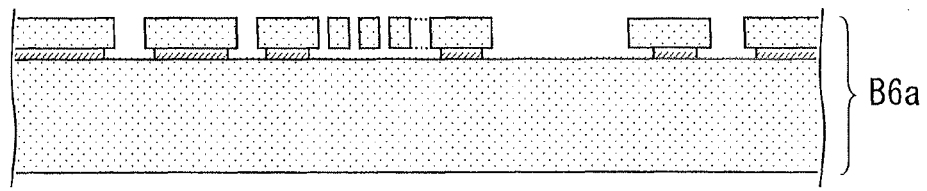
Figure 26B:
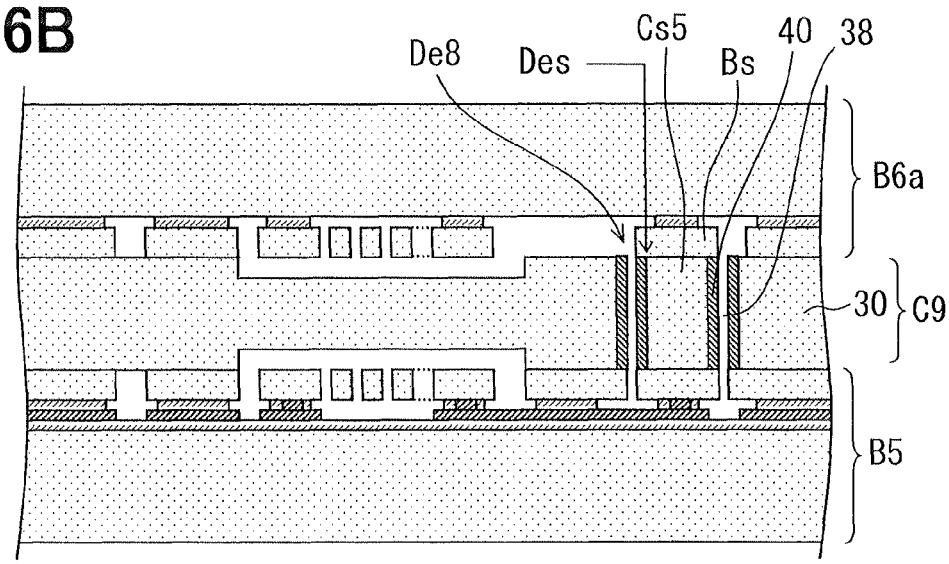

Next, in FIG. 26B, the primary base substrate B6a, which has been formed to have the acceleration sensor element as shown in FIG. 26A, is turned upside down and bonded to the cap substrate C9.

Figure 26C:
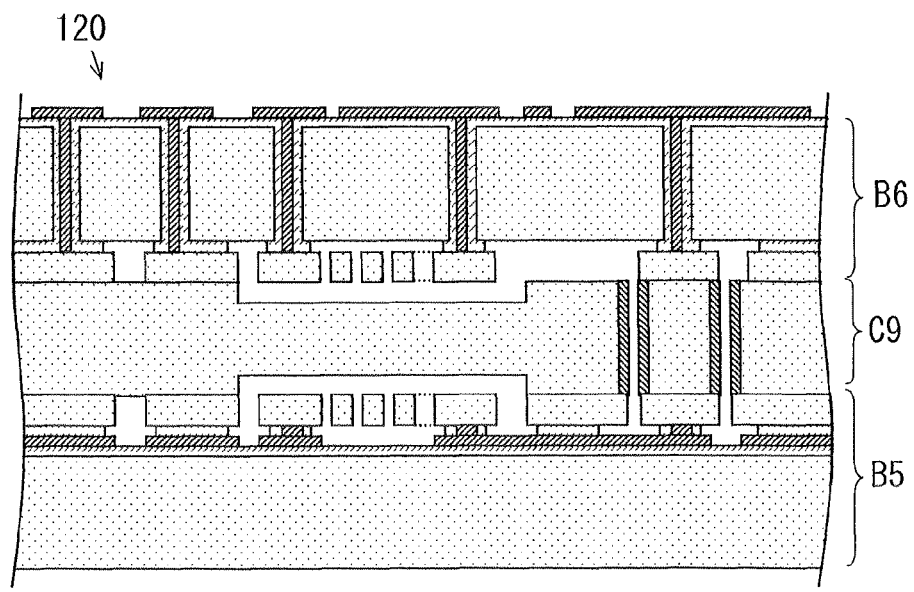

Then, in FIG. 26C, wiring processing for making electrical connections is conducted in the primary base substrate B6a, and thus the base substrate B6 is finished.

In this way, the semiconductor device 120 shown in FIG. 24 is manufactured.

As described in the above, the primary groove 38a is formed in the primary cap substrate C9a in the cap substrate forming step. Then, the metal layer 40d is formed on the side wall of the primary groove 38a, as a part of the leading electrode forming step, to form a primary leading electrode De8a. In a substrate bonding step shown in FIG. 25C, the base substrate B5 and the primary cap substrate C9a are bonded in such a manner that the opening of the primary groove 38a is opposed to the upper surface of the base substrate B5. After the substrate bonding step, as shown in FIG. 25D, the primary cap substrate C9a is grinded from the top, that is, from a side opposite to the base substrate B5, to make the cap substrate C9. Thus, the primary leading electrode De8a and the primary groove 38a, respectively, become the leading electrode De8 and the groove 38. The metal layer 40d formed on the side wall of the primary groove 38a becomes the metal part 40 of the leading electrode De8.

In each of the above-described semiconductor devices 100, 110 to 114 and 120 as examples of the semiconductor device according to the embodiment, the cap substrate C4 to C10 is bonded to the base substrate B4 to B6 to protect the base substrate B4 to B6. Further, the leading electrode De1 to De8 for making the electrical connection with the external part at the end thereof is formed such that the resistance of the leading electrode De1 to De8 is reduced and the parasitic capacitance around the leading electrode De1 to De8 will not be easily formed.

The above-described semiconductor devices 110, 110 to 114 and 120 as examples of the semiconductor device according to the embodiment each has the mechanical quantity sensor element for detecting acceleration and/or angular velocity. As another example, the semiconductor device according to the embodiment can have pressure sensor element, micro electro mechanical system (MEMS) resonator, infrared radiation sensor element, or any other semiconductor sensor element.

Figure 27:
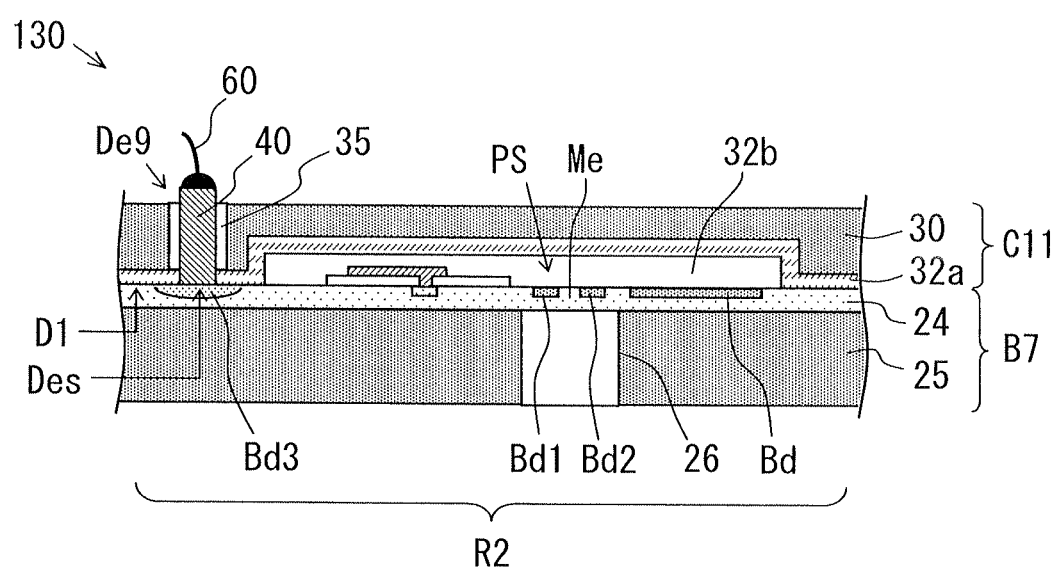
FIG. 27 is a schematic cross-sectional view of a part of a semiconductor device as an example of the semiconductor device according to the embodiment.

FIG. 27 is a schematic cross-sectional view of a semiconductor device 130 having a pressure sensor element PS as an example of the semiconductor device according to the embodiment. In FIG. 27, parts similar to the preceding parts are denoted with like reference characters.

The semiconductor device 130 has a base substrate B7. The base substrate B7 includes a single crystal silicon substrate 25. The thin single crystal silicon layer 24 having different conductivity types is formed at an upper surface layer of the single crystal silicon substrate 25. A deep, groove 26 is formed at a predetermined region R2 of the base substrate B7. The groove 26 extends from a bottom surface to an upper surface of the single crystal silicon substrate 25, and a membrane Me is formed above the groove 26. The single crystal silicon layer 24 has multiple impurity diffused regions (base semiconductor regions) Bd, which are insulated and separated from adjacencies by PN-junction separation, in the predetermined region R2.

The membrane Me also has impurity diffused regions Bd1, Bd2. The impurity diffused regions Bd1, Bd2 serve as a pressure sensor element PS. That is, in the semiconductor device 130, the membrane Me displaces in accordance with pressure applied through the groove 26. Thus, a change in resistance of the impurity diffused regions Bd1, Bd2 in accordance with the displacement is measured to detect the applied pressure.

Also in the semiconductor device 130, a cap substrate C11 is bonded to the base substrate B7 made of silicon at the bonding surface D1 and a sealed space is formed above the membrane Me. The semiconductor device 130 has a leading electrode De9 constructed of the metal part 40. A lower end of the leading electrode De9 connects to an impurity diffused region (base semiconductor region) Bd3 of the base substrate B7. The leading electrode De9 extends from the upper surface of the base substrate B7 to the upper surface of the cap substrate C4 through the groove 35 of the cap substrate C11. For example, an upper end of the metal part 40 is located higher than the upper surface of the cap substrate C11 The bonding wire 60 is connected to an upper end of the leading electrode De9.

FIGS. 28A to 28D and FIGS. 29A to 29D are schematic cross-sectional views for showing a process of manufacturing the semiconductor device 130 shown in FIG. 27.

Figure 28A:
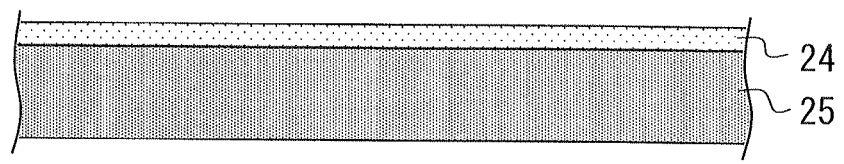
FIGS. 28A to 28D and 29A to 29D are schematic cross-sectional views for showing a process of manufacturing the semiconductor device shown in FIG. 27.

In FIG. 28A, the base substrate 87 is formed. Specifically, the thin single crystal silicon layer 24 having the different conductivity types is formed at the upper surface layer of the single crystal silicon substrate 25.

In FIG. 18B, structures such as the impurity diffused regions (base semiconductor regions) Bd, Bd1 to Bd3 as shown in FIG. 27, except the groove 26, are formed in the predetermined region R2 of the single crystal silicon layer 24.

Figure 28B:
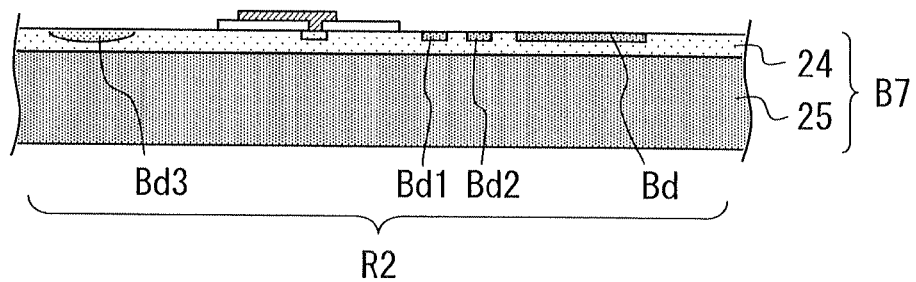
Figure 28C:
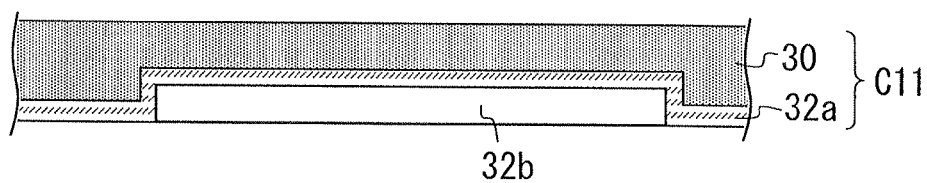

In FIG. 28C, the cap substrate C11 is formed. For example, the insulating layer 32a and the recess 32b are formed on the lower surface of the single crystal silicon substrate 30, in the similar manner as the cap substrate forming process shown in FIGS. 4A to 4C.

Figure 28D:
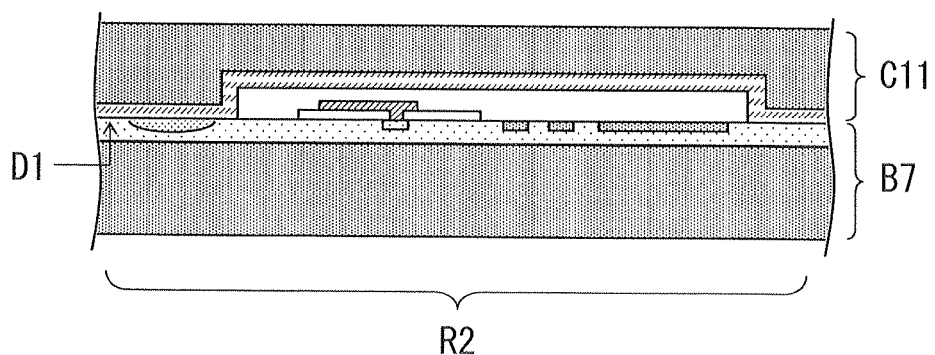

In FIG. 28D, the base substrate B7 formed in the step shown in FIG. 28B and the cap substrate C11 formed in the step shown in FIG. 28C are positioned relative to each other and bonded to each other.

Figure 29A:
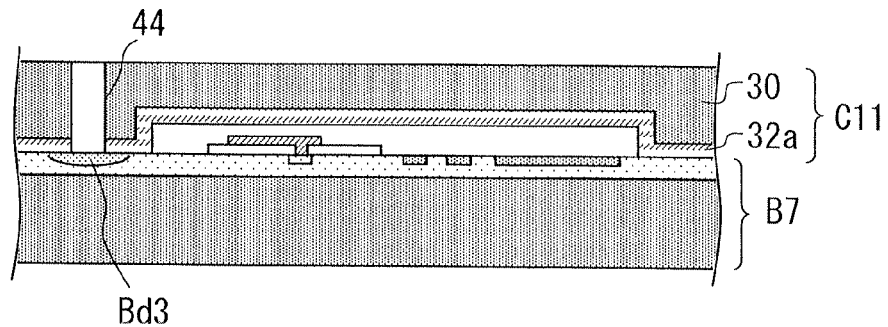

Next, in FIG. 29A, a trench 44 is formed at a predetermined position of the cap substrate C11 to reach the impurity diffused region Bd3 of the base substrate B7.

Figure 29B:
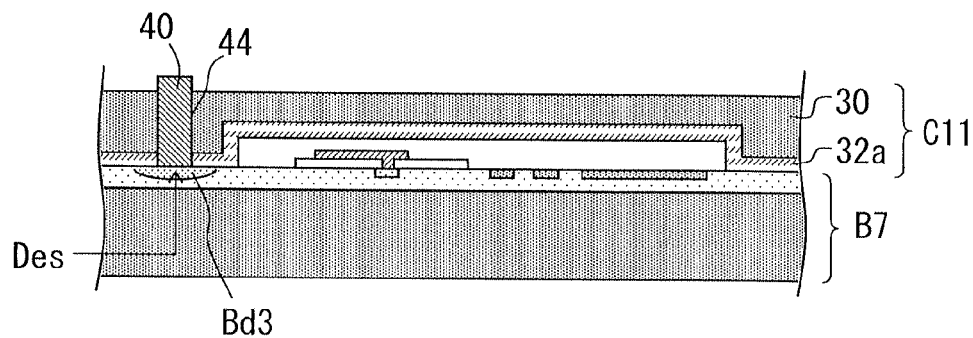

In FIG. 29B, the metal part 40 is embedded in the trench 44, and then the upper surface of the cap substrate C11, that is, the upper surface of the single crystal silicon substrate 30 is etched such that the upper end of the metal part 40 is located higher than the upper surface of the cap substrate C11.

Figure 29C:
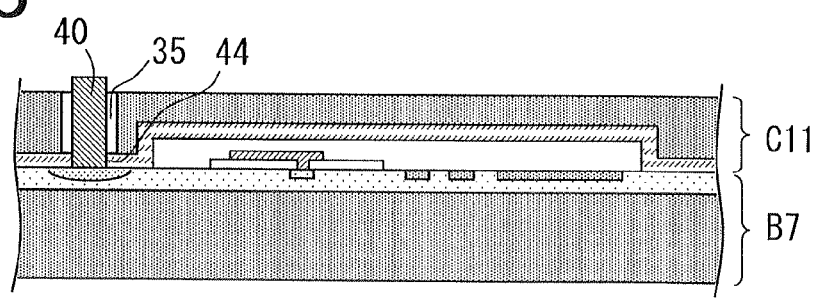

In FIG. 29C, a peripheral portion of the trench 44 in which the metal part 44 has been embedded is etched to form the groove 35.

Figure 29D:
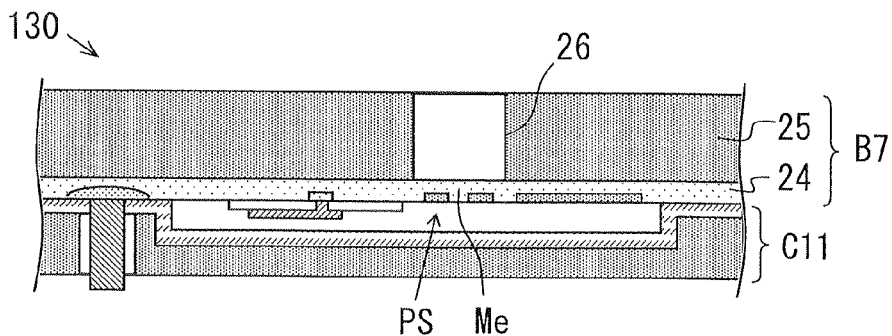

In FIG. 29D, the bonded base substrate B7 and cap substrate C11 is turned upside down, and the groove 26 is formed from a back side, that is, from the top in FIG. 29D. Thus, the membrane Me, as a thin membrane portion, is formed. Accordingly, the pressure sensor element PS is formed.

In this way, the semiconductor device 130 shown in FIG. 27 is manufactured.

Similar to the semiconductor device 100 shown in FIGS. 1A and 1B, the semiconductor device 130 shown in FIG. 27 has the leading electrode De9 constructed of the metal part 40, and the groove 35 is formed between the metal part 40 and the cap substrate C11. The upper end of the leading electrode De9 allows the electrical connection with the external part. Therefore, resistance of the leading electrode De9 is reduced, and parasitic capacitance will not be easily formed around the leading electrode De9.

The semiconductor device according to the embodiment can be implemented by combining the above described exemplary semiconductor devices in various ways. Also, as an example of the semiconductor device according to the embodiment, a semiconductor device having a chip in which the mechanical quantity sensor elements, such as the acceleration sensor element and the angular velocity sensor element as shown in FIG. 1 and the pressure sensor element PS as shown in FIG. 27 are formed and the leading electrode constructed of the metal part separated from the cap substrate by the groove is applicable.

Additional advantages and modifications will readily occur to those skilled in the art. The invention in its broader term is therefore not limited to the specific details, representative apparatus, and illustrative examples shown and described.

What is claimed is:

1. A semiconductor device comprising:
   a base substrate made of silicon, the base substrate having a plurality of base semiconductor regions in a predetermined portion of a surface layer thereof, the plurality of base semiconductor regions being insulated and separated from each other;
   a cap substrate bonded to the predetermined portion of the surface layer of the base substrate; and
   a leading electrode including a metal part, the leading electrode passing through the cap substrate, the leading electrode having a first end connected to one of the plurality of base semiconductor regions of the base substrate and a second end located adjacent to a surface of the cap substrate for allowing an electrical connection with an external part, the surface being opposite to a bonding surface at which the base substrate and the cap substrate are bonded, wherein the leading electrode defines a groove between an outer surface thereof and the cap substrate, wherein
   the cap substrate is made of silicon,
   the cap substrate has a plurality of partial regions insulated and separated from each other,
   the leading electrode is constructed of the metal part and one of the plurality of partial regions,
   the metal part is disposed to cover a side surface and an end surface of the one of the plurality of partial regions, the end surface being adjacent to the second end of the leading electrode, and
   the groove is provided by an empty or unfilled space defined between an outer surface of the metal part, which covers the side surface of the one of the plurality of partial regions, and the cap substrate which is disposed on a periphery of the leading electrode.

2. The semiconductor device according to claim 1, wherein
   the cap substrate is made of single crystal silicon, and
   another one of the plurality of partial regions is provided with an integrated circuit.

3. The semiconductor device of claim 1, wherein
   the second end of the leading electrode is located further from the bonding surface than the surface of the cap substrate, and
   the second end of the leading electrode has an area greater than an area of the first end.

4. The semiconductor device of claim 1, wherein the groove further is disposed on an entire circumference of the leading electrode, and the groove extends at least to the surface of the cap substrate opposite to the bonding surface.

* * * * *